(12) United States Patent
Miyoshi

(10) Patent No.: US 11,516,423 B2
(45) Date of Patent: Nov. 29, 2022

(54) PHOTOELECTRIC CONVERSION DEVICE AND IMAGE FORMING APPARATUS

(71) Applicant: Yuuya Miyoshi, Osaka (JP)

(72) Inventor: Yuuya Miyoshi, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 57 days.

(21) Appl. No.: 17/195,869

(22) Filed: Mar. 9, 2021

(65) Prior Publication Data

US 2021/0297618 A1 Sep. 23, 2021

(30) Foreign Application Priority Data

Mar. 18, 2020 (JP) .............................. JP2020-048418

(51) Int. Cl.
*H04N 5/369* (2011.01)
*H04N 5/378* (2011.01)
*H01L 27/146* (2006.01)
*H04N 5/374* (2011.01)

(52) U.S. Cl.
CPC ....... *H04N 5/378* (2013.01); *H01L 27/14603* (2013.01); *H01L 27/14609* (2013.01); *H01L 27/14643* (2013.01); *H04N 5/3692* (2013.01); *H04N 5/374* (2013.01)

(58) Field of Classification Search
None
See application file for complete search history.

(56) References Cited

U.S. PATENT DOCUMENTS

| | | | | |
|---|---|---|---|---|
| 4,654,536 | A | * | 3/1987 | Saito ................. H01L 27/14603 250/226 |
| 6,201,616 | B1 | * | 3/2001 | Sasanuma .......... H04N 1/00875 358/450 |
| 9,131,183 | B2 | | 9/2015 | Miyoshi et al. |
| 9,781,278 | B2 | | 10/2017 | Miyoshi et al. |
| 9,986,185 | B2 | | 5/2018 | Kamezawa et al. |
| 10,079,989 | B2 | | 9/2018 | Kudoh et al. |
| 10,212,373 | B2 | | 2/2019 | Kamezawa et al. |
| 10,446,595 | B2 | | 10/2019 | Miyoshi et al. |
| 10,582,142 | B2 | | 3/2020 | Miyoshi et al. |
| 10,609,244 | B2 | | 3/2020 | Nakazawa et al. |
| 10,630,968 | B2 | | 4/2020 | Suzuki et al. |

(Continued)

FOREIGN PATENT DOCUMENTS

JP 2019-041226 3/2019

*Primary Examiner* — Twyler L Haskins
*Assistant Examiner* — Wesley J Chiu
(74) *Attorney, Agent, or Firm* — IPUSA, PLLC

(57) ABSTRACT

A photoelectric conversion device includes first to fourth pixel columns. Each of the first to fourth pixel columns includes a plurality of pixels arranged in a predetermined direction. Each of the plurality of pixels arranged in the first to fourth pixel columns includes a photoelectric conversion element configured to receive light of a wavelength region and generate a signal charge. Each of the plurality of pixels arranged in the first to fourth pixel columns further includes a circuit configured to convert the signal charge generated by the photoelectric conversion element into a voltage signal. Directions of reading the voltage signals from the first pixel column and the second pixel column are different from directions of reading the voltage signals from the third pixel column and the fourth pixel column.

15 Claims, 15 Drawing Sheets

(56) References Cited

U.S. PATENT DOCUMENTS

| | | | |
|---|---|---|---|
| 10,652,498 B2 | 5/2020 | Miyoshi et al. | |
| 10,728,480 B2 | 7/2020 | Suzuki | |
| 2006/0169871 A1* | 8/2006 | Kochi | H04N 5/378 |
| | | | 348/E3.018 |
| 2007/0138375 A1* | 6/2007 | Lee | H04N 5/3575 |
| | | | 250/214 R |
| 2009/0303340 A1* | 12/2009 | Itano | H04N 5/378 |
| | | | 348/222.1 |
| 2016/0119495 A1* | 4/2016 | Konno | H04N 1/193 |
| | | | 358/1.13 |
| 2018/0255253 A1* | 9/2018 | Suzuki | H04N 5/3742 |
| 2018/0261642 A1* | 9/2018 | Asaba | H04N 9/04557 |
| 2019/0393252 A1 | 12/2019 | Miyoshi et al. | |
| 2021/0006682 A1 | 1/2021 | Miyoshi | |
| 2021/0036037 A1 | 2/2021 | Matsumoto et al. | |

* cited by examiner

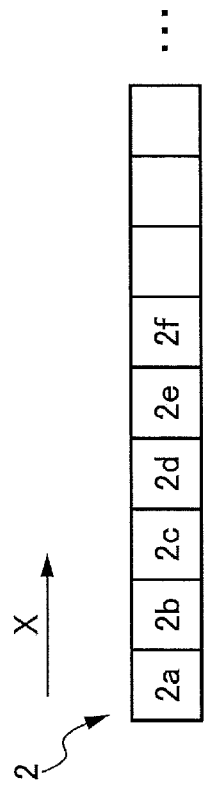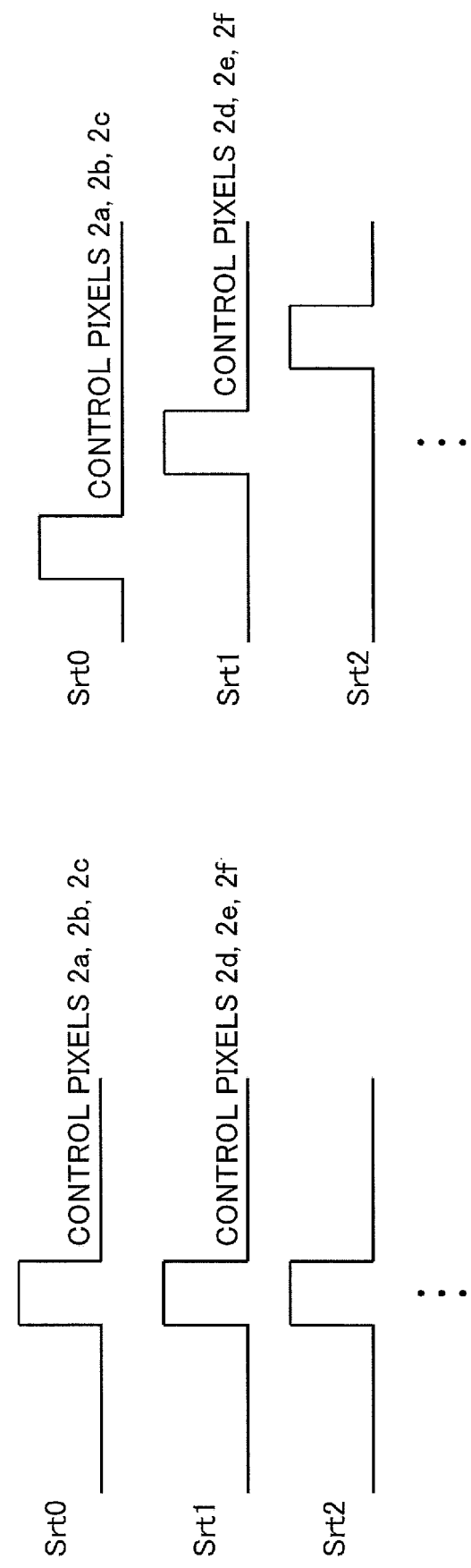

PHOTOELECTRIC CONVERSION DEVICE AND IMAGE FORMING APPARATUS

CROSS-REFERENCE TO RELATED APPLICATION

The present application is based on and claims priority under 35 U.S.C. § 119 to Japanese Patent Application No. 2020-048418, filed on Mar. 18, 2020, the contents of which are incorporated herein by reference in their entirety.

BACKGROUND OF THE INVENTION

1. Field of the Invention

The present invention relates to a photoelectric conversion device and an image forming apparatus.

2. Description of the Related Art

Conventionally, photoelectric conversion devices such as Complementary Metal Oxide Semiconductor (CMOS) image sensors used in scanners, multifunction peripherals, digital cameras and the like, are known.

Further, a configuration for controlling the reading of a signal in a photoelectric conversion device is disclosed (see, for example, Patent Document 1).

Patent Document 1: Japanese Unexamined Patent Application Publication No. 2019-041226

SUMMARY OF THE INVENTION

According to one aspect of the present invention, there is provided a photoelectric conversion device including a first pixel column in which a plurality of pixels are arranged in a predetermined direction, each of the plurality of pixels including a first photoelectric conversion element configured to receive light of a first wavelength region and generate a signal charge, and a first circuit configured to convert the signal charge generated by the first photoelectric conversion element into a voltage signal; a second pixel column in which a plurality of pixels are arranged in the predetermined direction, each of the plurality of pixels including a second photoelectric conversion element configured to receive light of a second wavelength region and generate a signal charge, and a second circuit configured to convert the signal charge generated by the second photoelectric conversion element into a voltage signal; a third pixel column in which a plurality of pixels are arranged in the predetermined direction, each of the plurality of pixels including a third photoelectric conversion element configured to receive light of a third wavelength region and generate a signal charge, and a third circuit configured to convert the signal charge generated by the third photoelectric conversion element into a voltage signal; and a fourth pixel column in which a plurality of pixels are arranged in the predetermined direction, each of the plurality of pixels including a fourth photoelectric conversion element configured to receive light of a fourth wavelength region and generate a signal charge, and a fourth circuit configured to convert the signal charge generated by the fourth photoelectric conversion element into a voltage signal, wherein directions of reading the voltage signals from the first pixel column and the second pixel column are different from directions of reading the voltage signals from the third pixel column and the fourth pixel column.

BRIEF DESCRIPTION OF THE DRAWINGS

FIGS. 6A and 6B are diagrams illustrating a detailed configuration example of a pixel, wherein FIG. 6A is a diagram illustrating an example of a component configuration, and FIG. 6B is a diagram illustrating an example of a circuit configuration according to the first embodiment of the present invention;

FIGS. 9A and 9B are diagrams illustrating an example of the coupling between a photoelectric conversion device and a signal processing circuit at a later stage, wherein FIG. 9A is a diagram illustrating the coupling according to a comparison example, and FIG. 9B is a diagram illustrating the coupling according to the first embodiment of the present invention;

FIGS. 10A to 10C are diagrams of an example of a pixel rolling method, wherein FIG. 10A is a diagram of an example of the pixel arrangement, FIG. 10B is a diagram of an example of the rolling method according to the comparison example, and FIG. 10C is a diagram of an example of the rolling method according to the first embodiment of the present invention;

FIGS. 11A to 11D are diagrams for describing an example of the disposition of the photodiode and the pixel circuit according to a second embodiment of the present invention, wherein FIG. 11A illustrates a disposition according to a first comparison example, FIG. 11B illustrates a disposition according to a second comparison example, FIG. 11C illustrates a disposition according to a third comparison example, and FIG. 11D illustrates a disposition according to the second embodiment of the present invention;

DETAILED DESCRIPTION OF THE PREFERRED EMBODIMENTS

Figure 1:
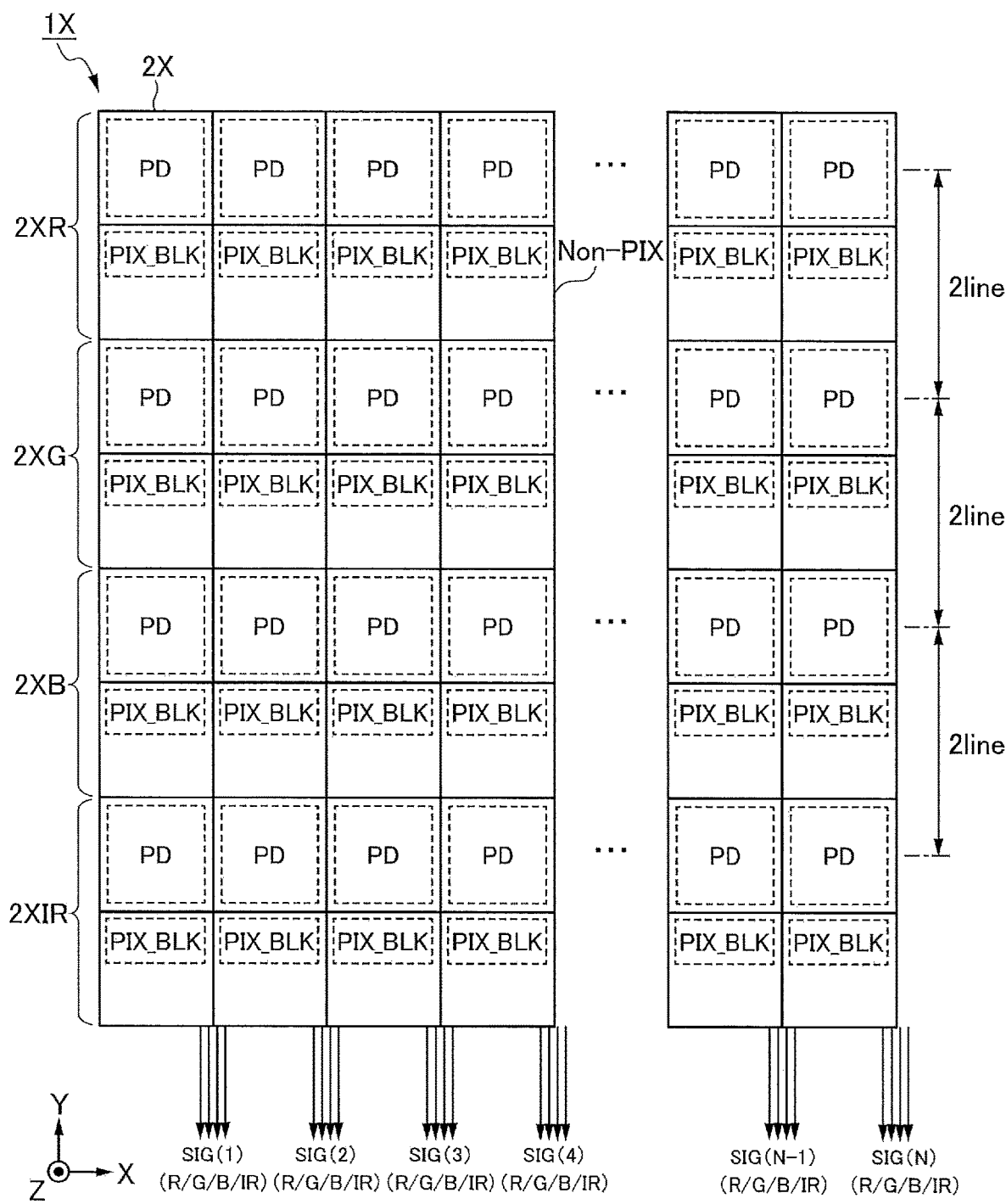
FIG. 1 is a diagram illustrating the transmission of a voltage signal of a photoelectric conversion device according to a comparison example.

In the conventional technology, voltage signals are read in the same direction from a plurality of pixels included in the photoelectric conversion device, and, therefore, the number of signal lines increases, and there are cases where the voltage signals cannot be read from the pixels with high sensitivity.

A problem to be addressed by an embodiment of the present invention is to read voltage signals from pixels with high sensitivity.

Hereinafter, an embodiment for carrying out the present invention will be described with reference to the drawings. In the respective drawings, the same elements are denoted by the same reference numerals, and overlapping descriptions are omitted accordingly.

An embodiment will be described, in which an example of a photoelectric conversion device including four lines of image sensors respectively including pixels for red, green, and blue, and in addition, pixels for near-infrared light. In the description of the embodiment, the red color is abbreviated as R, the green color is abbreviated as G, the blue color is abbreviated as B, and near-infrared light is abbreviated as IR.

Here, the wavelength region of R includes at least a wavelength region corresponding to a red color of approximately 580 nm to 650 nm, and is an example of the first wavelength region. The wavelength region of G includes at least a wavelength region corresponding to a green color of approximately 510 nm to 580 nm, and is an example of a second wavelength region. The wavelength region of B includes at least a wavelength region corresponding to a blue color of approximately 410 nm to 490 nm, and is an example of a third wavelength region. The wavelength region of the IR includes at least a wavelength region corresponding to near-infrared light of approximately 750 nm to 1400 nm, and is an example of a fourth wavelength region.

COMPARISON EXAMPLE

First, a photoelectric conversion device according to a comparison example will be described. FIG. 1 is a diagram illustrating the transmission of a voltage signal of a photoelectric conversion device 1X according to a comparison example.

As illustrated in FIG. 1, the photoelectric conversion device 1X includes a plurality of pixels 2X. The plurality of the pixels 2X include a pixel column 2XR for R, a pixel column 2XG for G, a pixel column 2XB for B, and a pixel column 2XIR for IR. Each of the pixel columns 2XR, 2XG, 2XB, and 2XIR is configured by arranging a plurality of the pixels 2X of each color in the X direction. The photoelectric conversion device 1X is configured by arranging the pixel columns 2XR, 2XG, 2XB, and 2XIR with respect to each other in the Y direction. Here, the X direction is an example of a "predetermined direction".

Each of the pixels 2X includes a photodiode PD that receives incident light to generate a signal charge, and a pixel circuit PIX_BLK that converts the generated signal charge into a voltage signal. Each of the pixels 2X outputs a voltage signal corresponding to the light intensity of the incident light.

The voltage signals output by the respective pixels 2X are transmitted by signal lines SIG(1) to SIG(N) along the Y direction, and are read from the end portion on the −Y direction side. The signal lines SIG(1) to SIG(N) transmit and output voltage signals of the pixels 2X corresponding to each of R, G, B, and IR. In the following, when the signal line is not particularly distinguished among (1) to (N), the signal line is expressed as the signal line SIG.

Figure 2:
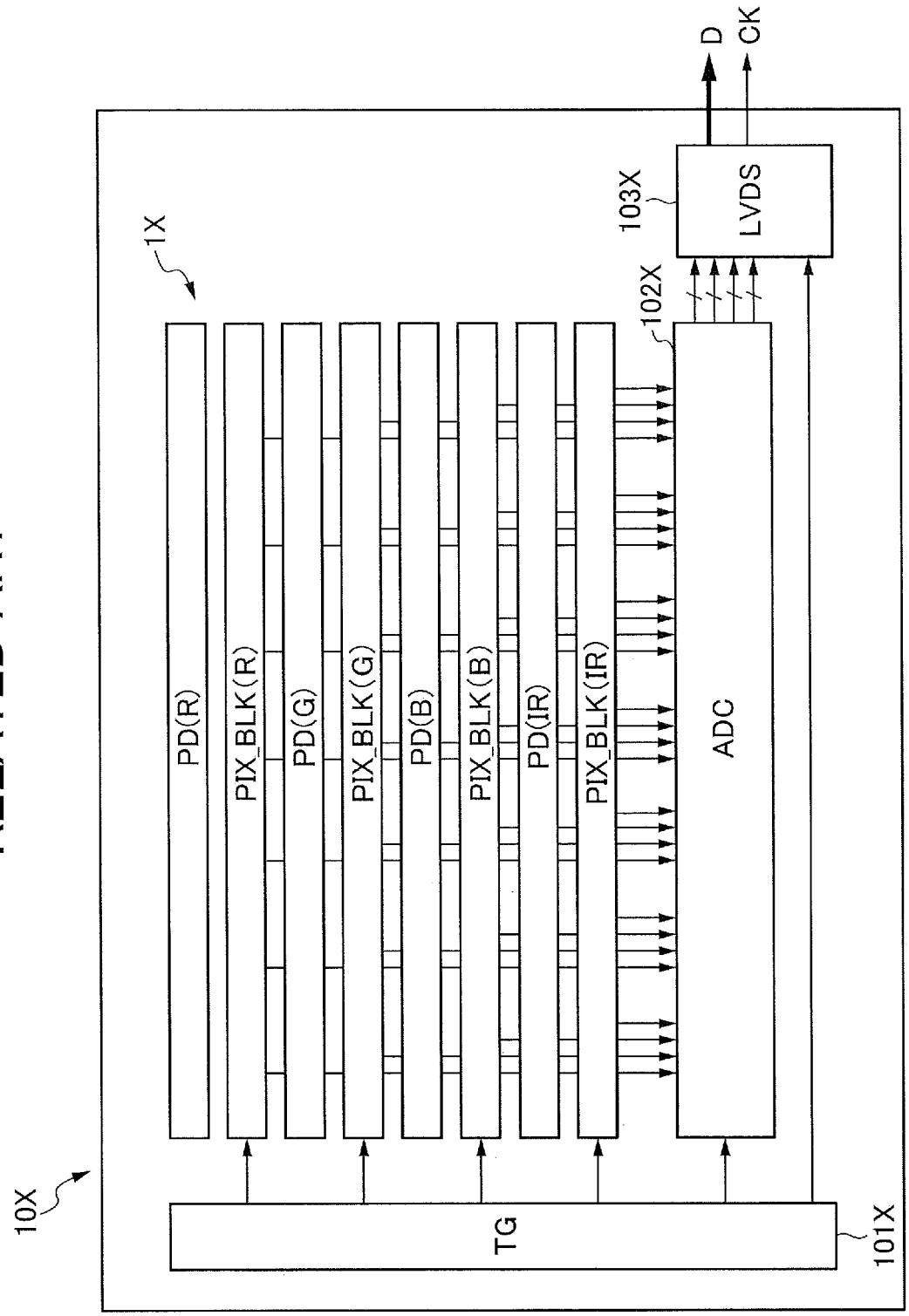
FIG. 2 is a diagram illustrating a configuration of a signal processing device including a photoelectric conversion device according to a comparison example.

Next, FIG. 2 is a diagram illustrating a configuration of a linear image sensor 10X including the photoelectric conversion device 1X. The linear image sensor 10X includes the photoelectric conversion device 1X, a timing generation circuit 101X, an Analog/Digital (A/D) conversion circuit 102X, and a Low Voltage Differential Signaling (LVDS) circuit 103X.

A voltage signal is independently read from each of the pixel columns 2XR, 2XG, 2XB, and 2XIR of the photoelectric conversion device 1X in accordance with a control signal from the timing generation circuit 101X. The read voltage signal is subjected to A/D conversion by the A/D conversion circuit 102X, and is then transferred to an external device via the LVDS circuit 103X. This configuration allows simultaneous reading of voltage signals according to the optical intensity of R, G, B, and IR.

Figure 3:
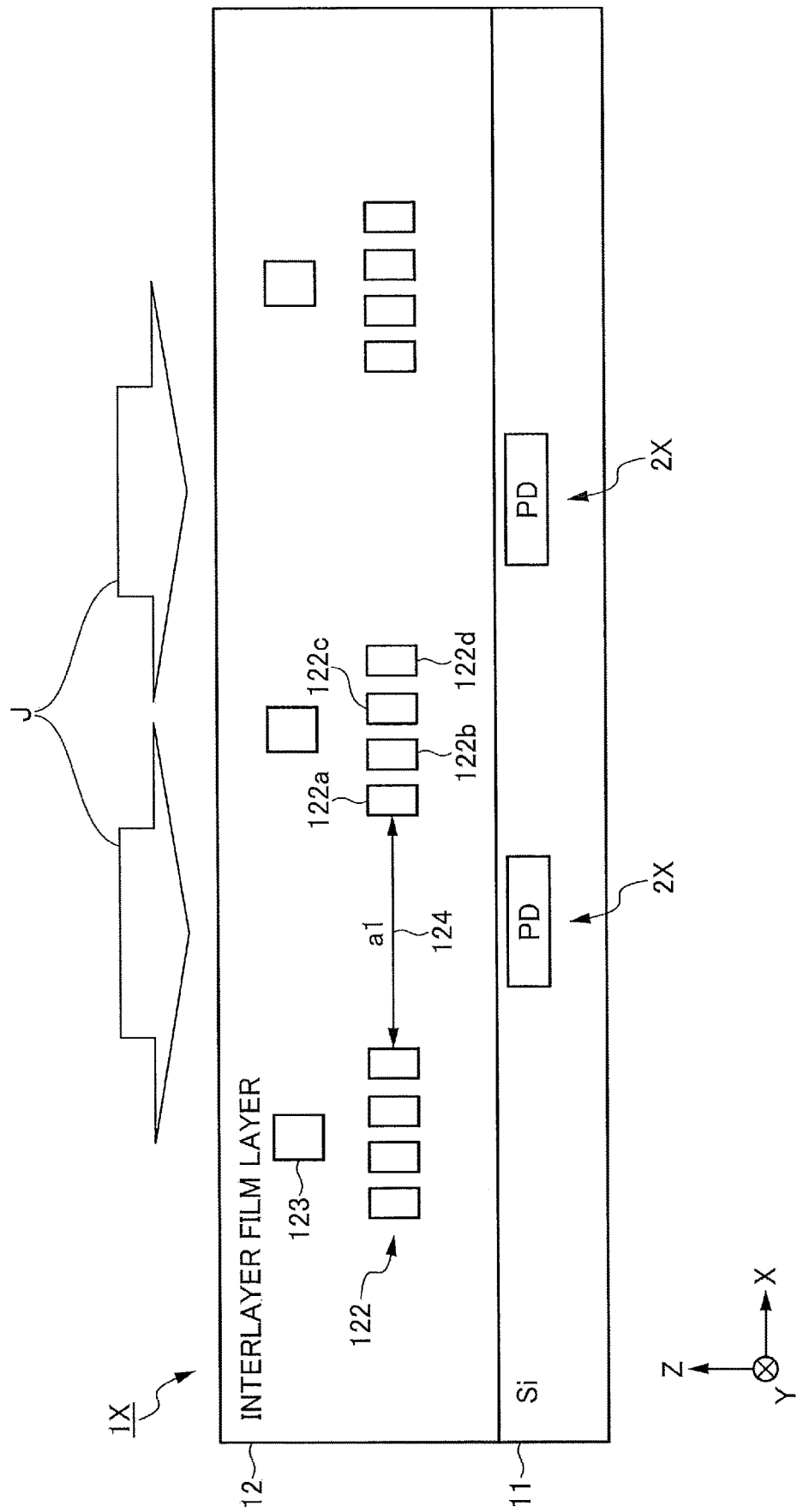
FIG. 3 is a diagram illustrating the influence of the signal line between adjacent pixels on the sensitivity of the voltage signal according to a comparison example.

Next, FIG. 3 is a diagram illustrating the influence of the signal lines between adjacent pixels, on the sensitivity of the voltage signal, and illustrates a cross-section of the photoelectric conversion device 1X. A silicon substrate 11 including a photodiode PD, and an interlayer film layer 12, are stacked in the Z direction to configure the photoelectric conversion device 1X.

Metal wiring portions 122 and 123 are provided within the interlayer film layer 12. The metal wiring portions 122 and 123 are made of a metallic material such as aluminum or copper, and function as signal lines for transmitting signals. For example, the metal wiring portion 122 functions as a signal line for transmitting a control signal, and the metal wiring portion 123 functions as a signal line for transmitting the read signal of a voltage signal of each pixel or a signal line for transmitting a power signal.

Further, the metal wiring portions 122 and 123 reflect light incident on the interlayer film layer 12 and do not transmit the incident light, and, therefore, an opening formed by the metal wiring portions 122 and 123 functions as an opening (aperture) for defining the light that reaches the photodiode PD among the light incident on the interlayer film layer 12.

A length a1 illustrated in FIG. 3 represents the length of one side of a rectangular-shaped opening portion 124 formed by the metal wiring portion 122 or 123. Note that the opening portion 124 may be formed to have a circular shape, in which case a1 corresponds to the diameter of the opening portion 124.

Here, in the photoelectric conversion device 1X, any of the read signals of the pixels 2X is read from the end portion of the −Y direction side. Therefore, at least four signal lines SIG for R, G, B, and IR pass between the adjacent pixels 2X. Signal lines 122a, 122b, 122c, and 122d included in the metal wiring portion 122 of FIG. 3 illustrate the metal wirings that function as the four signal lines SIGs for R, G, B, and IR.

Specifically, the signal line 122a is a signal line that transmits a voltage signal of the pixel column 2XR in the signal line SIG(1). Similarly, the signal line 122b is a signal line that transmits a voltage signal of the pixel column 2XG in the signal line SIG(1). The signal line 122c is a signal line that transmits a voltage signal of the pixel column 2XB in the signal line SIG(1). The signal line 122d is a signal line that transmits a voltage signal of the pixel column 2XIR in the signal line SIG(1).

Thus, as the number of signal lines between the adjacent pixels 2X increases, the area occupied by the metal wiring portion 122 increases, thereby shortening the length of one side of the opening portion 124. As the length of one side of the opening portion 124 becomes short, the opening area of the opening portion 124 decreases, light passing through the opening portion 124 and reaching the photodiode PD decreases, and the amount of light that can be received by the photodiode PD decreases. Accordingly, the sensitivity of the voltage signal may be reduced, and it may not be possible to read the voltage signal from the pixel with high sensitivity.

Therefore, in the embodiment, the photoelectric conversion device is configured such that, among the four pixel columns for R, G, B, and IR, the direction of reading the voltage signal from two pixel columns is different from the direction of reading the voltage signal from the other two pixel columns. Accordingly, the number of signal lines for transmitting voltage signals between adjacent pixels in each pixel column is reduced, the area occupied by the metal wiring portion 122 is reduced, and the opening area of the opening portion formed by the signal lines between adjacent pixels is increased. Then, the amount of light passing through the opening portion and incident on the photodiode is increased, so that the voltage signal can be read from the pixel with high sensitivity.

First embodiment

Next, a photoelectric conversion device 1 according to the first embodiment will be described.

<Example of Configuration of the Photoelectric Conversion Device 1>

Figure 4:
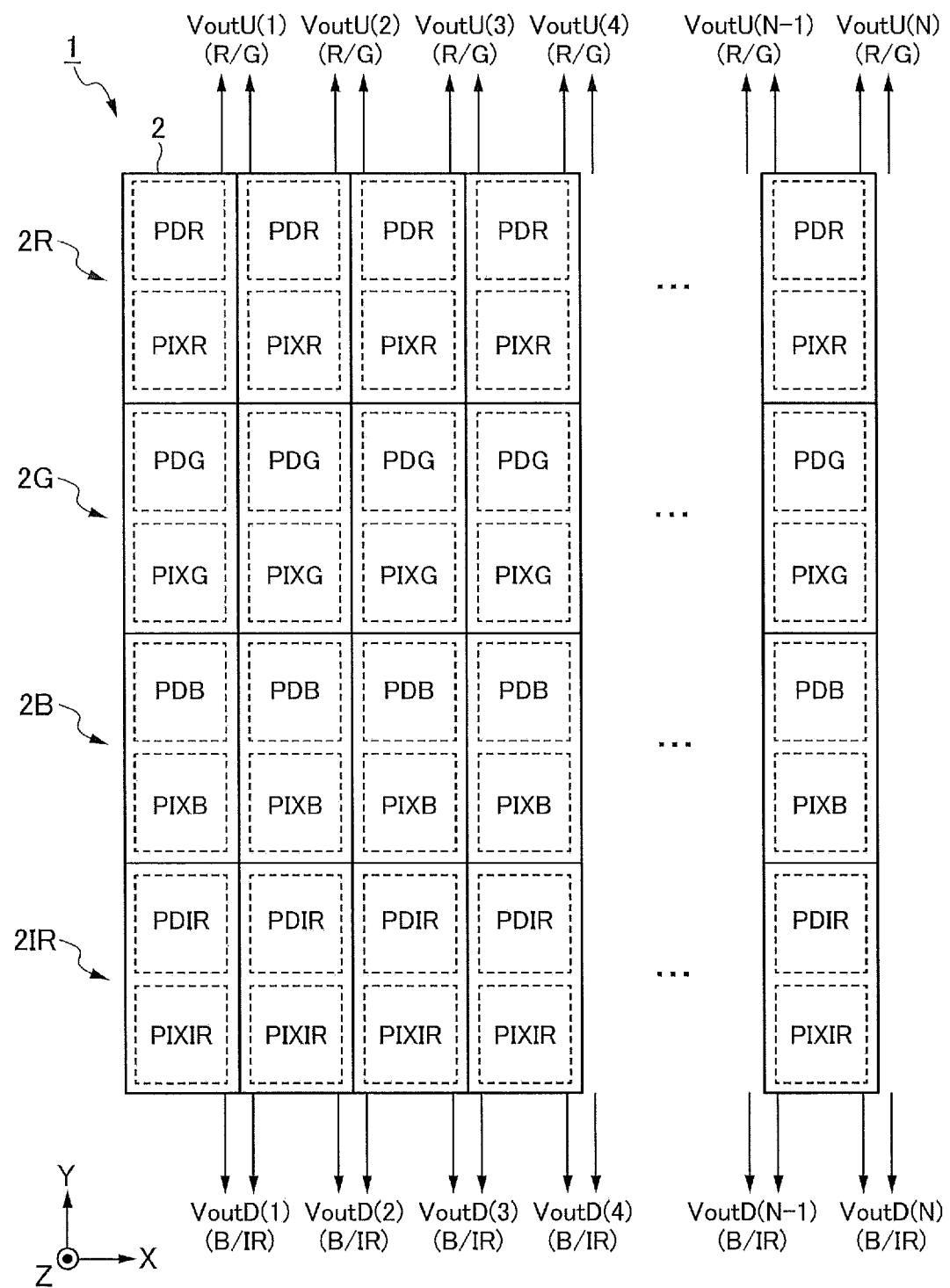
FIG. 4 is a diagram illustrating an example of a configuration of a photoelectric conversion device according to a first embodiment of the present invention.

FIG. 4 is a diagram illustrating an example of the configuration of the photoelectric conversion device 1. As illustrated in FIG. 4, the photoelectric conversion device 1 includes a plurality of the pixels 2. The plurality of the pixels 2 include a pixel column 2R for R, a pixel column 2G for G, a pixel column 2B for B, and a pixel column 2IR for IR.

The pixel column 2R is configured by arranging a plurality of the pixels 2 in the X direction, wherein each of the plurality of the pixels 2 includes a photodiode PDR that receives light in the wavelength region of R to generate a signal charge, and a pixel circuit PIXR that converts the signal charge into a voltage signal. Here, the photodiode PDR is an example of a "first photoelectric conversion element", the pixel circuit PIXR is an example of a "first circuit", and the pixel column 2R is an example of a "first pixel column".

The pixel column 2G is configured by arranging a plurality of the pixels 2 in the X direction, wherein each of the plurality of the pixels 2 includes a photodiode PDG that receives light in the wavelength region of G to generate a signal charge, and a pixel circuit PIXG that converts the signal charge into a voltage signal. Here, the photodiode PDG is an example of a "second photoelectric conversion element", the pixel circuit PIXG is an example of a "second circuit", and the pixel column 2G is an example of a "second pixel column".

The pixel column 2B is configured by arranging a plurality of the pixels 2 in the X direction, wherein each of the plurality of the pixels 2 includes a photodiode PDB that receives light in the wavelength region of B to generate a signal charge, and a pixel circuit PIXB that converts the signal charge into a voltage signal. Here, the photodiode PDB is an example of a "third photoelectric conversion element", the pixel circuit PIXB is an example of a "third circuit", and the pixel column 2B is an example of a "third pixel column".

The pixel column 2IR is configured by arranging a plurality of the pixels 2 in the X direction, wherein each of the plurality of the pixels 2 includes a photodiode PDIR that receives light in the wavelength region of IR to generate a signal charge, and a pixel circuit PIXIR that converts the signal charge into a voltage signal. Here, the photodiode PDIR is an example of a "fourth photoelectric conversion element", the pixel circuit PIXIR is an example of a "fourth circuit", and the pixel column 2IR is an example of a "fourth pixel column".

The pixel columns 2R, 2G, 2B, and 2IR are arranged with respect to each other in the Y direction, thereby configuring the photoelectric conversion device 1.

Among the plurality of the pixels 2, the voltage signals output by each of the pixel column 2R and the pixel column 2G are transmitted in the +Y direction by the signal lines VoutU(1) to VoutU(N), and are read from the end portion on the +Y direction side. Among the plurality of the pixels 2, the voltage signals output by each of the pixel column 2B and the pixel column 2IR are transmitted in the −Y direction by the signal lines VoutD(1) to VoutD(N), and are read from the end portion on the −Y direction side.

Further, the direction of reading the voltage signals output from each of the pixel column 2R and the pixel column 2G is different from the direction of reading the voltage signals output from each of the pixel column 2B and the pixel column 2IR. The direction of reading the voltage signals of the pixel column 2R and the pixel column 2G, and the direction of reading the voltage signals of the pixel column 2B and the pixel column 2IR, are opposite directions to each other in the Y direction.

By this configuration, the number of signal lines passing between the adjacent pixels 2 can be reduced to two; that is, the number of signal lines can be reduced with respect to the four signal lines of the photoelectric conversion device 1X according to the comparison example.

Further, in the photoelectric conversion device 1, the pixel circuit PIX is disposed near the photodiode PD in each of the plurality of the pixels 2 so that the transmission distance is short, and, therefore, generation of noise is reduced in the interval between the signal charge generated by the photodiode and the pixel circuit.

Figure 5:
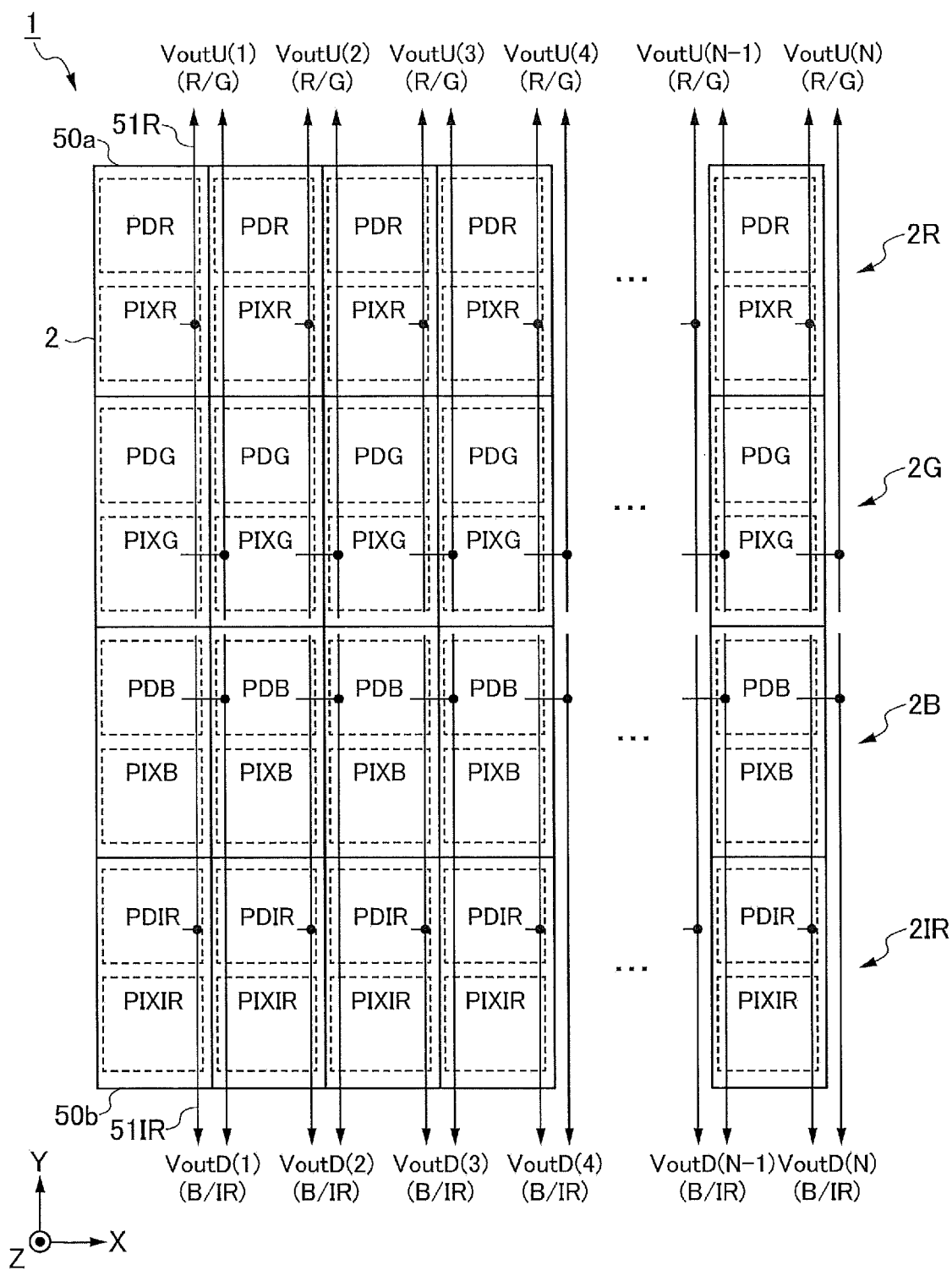
FIG. 5 is a diagram illustrating an example of a configuration for reading a voltage signal of each pixel according to the first embodiment of the present invention.

Next, FIG. 5 is a diagram illustrating an example of a configuration for reading the voltage signal of each of the pixels 2.

If the length of a signal line 51R for reading the voltage signal of the pixel column 2R, is from the position of the pixel column 2R in the Y direction to an end portion 50a on the +Y direction side, the voltage signal of the pixel column 2R can be read. However, in the present embodiment, as illustrated in FIG. 5, the signal line 51R is extended from the end portion 50a to the position where the pixel column 2G is disposed in the Y direction.

Further, the pixel column 2R is disposed closer to the side of the end portion 50a of the photoelectric conversion device 1 than the pixel column 2G, and the signal line 51R for reading the voltage signal of the pixel column 2R is provided so as to extend from the position where the pixel column 2G is disposed in the Y direction to the end portion 50a. Here, the position where the pixel column 2G is disposed in the Y direction is, for example, the position of a portion of the pixel circuit PIXG that is farthest from the end portion 50a in the Y direction.

In this way, two signal lines can be passed through also at the position of the pixel column 2G, and, therefore, the number of signal lines between adjacent pixels in the pixel column 2R can be equal to the number of signal lines between adjacent pixels in the pixel column 2G.

Similarly, if the length of a signal line 51IR for reading the voltage signal of the pixel column 2IR, is from the position of the pixel column 2IR in the Y direction to an end portion 50b on the −Y direction side, the voltage signal of the pixel column 2IR can be read. However, in the present embodiment, as illustrated in FIG. 5, the signal line 51IR is extended from the end portion 50b to the position where the pixel column 2B is disposed in the Y direction.

Further, the pixel column 2IR is disposed closer to the side of the end portion 50b of the photoelectric conversion device 1 than the pixel column 2B, and the signal line 51IR for reading the voltage signal of the pixel column 2IR is provided so as to extend from the position where the pixel column 2B is disposed in the Y direction to the end portion 50b. Here, the position where the pixel column 2B is disposed in the Y direction is, for example, the position of a portion of the pixel circuit PIXB that is farthest from the end portion 50b in the Y direction.

In this way, two signal lines can be passed through also at the position of the pixel column 2B, and, therefore, the number of signal lines between adjacent pixels in the pixel column 2IR can be equal to the number of signal lines between adjacent pixels in the pixel column 2B.

By equalizing the number of signal lines between adjacent pixels, the area occupied by the signal lines between adjacent pixels can be equalized for each color. Accordingly, the size (area of the opening) of the opening portion for each color is equalized, and the sensitivity of reading the voltage signal can be equalized for each color.

Here, the end portion 50a described above is an example of "one end of the photoelectric conversion device", and the end portion 50b described above is an example of "another end of the photoelectric conversion device".

<Example of detailed configuration of the pixel 2>

Figure 6B:
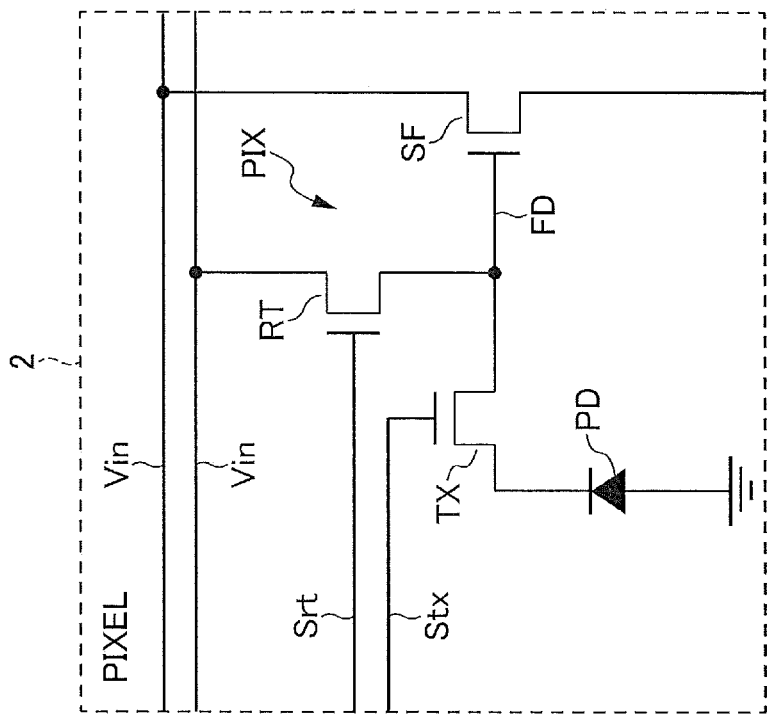
Figure 6A:
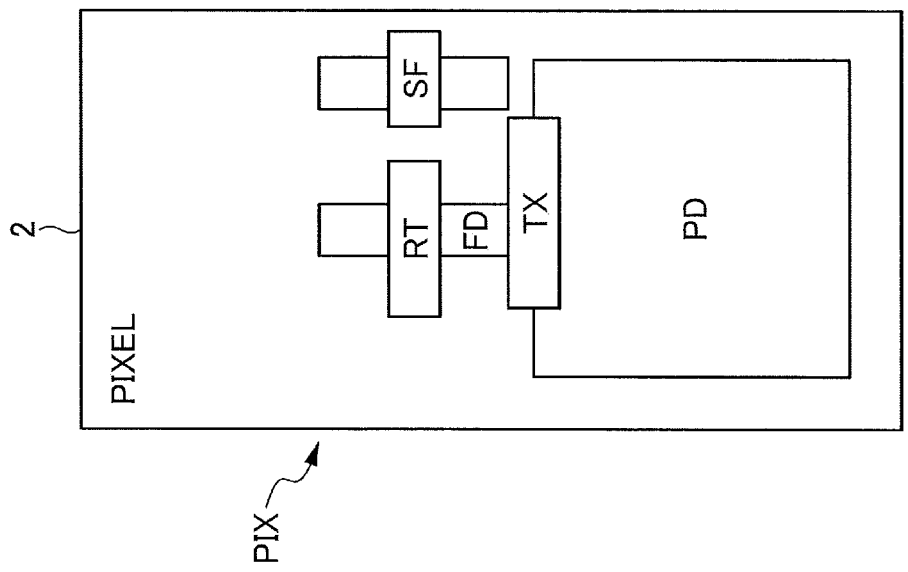

Next, a detailed configuration of the pixel 2 will be described with reference to FIGS. 6A and 6B. FIGS. 6A and 6B are diagrams illustrating an example of the detailed configuration of the pixel 2, wherein FIG. 6A is a diagram illustrating an example of a component configuration, and FIG. 6B is a diagram illustrating an example of a circuit configuration.

As illustrated in FIGS. 6A and 6B, the pixel 2 includes the photodiode PD, a transfer switch TX, an amplifier SF, and a reset switch RT.

The photodiode PD is a photoelectric conversion element that receives incident light and generates a signal charge. The anode of the photodiode PD is coupled to a ground voltage, and the cathode of the photodiode PD is coupled to one end of the transfer switch TX.

The other end of the transfer switch TX is coupled to one end of the amplifier SF and the reset switch RT. Here, the region to which the transfer switch TX, the amplifier SF, and the reset switch RT are coupled is referred to as a float diffusion region FD. The float diffusion region FD is the region that converts the signal charge generated by the photodiode PD into a voltage.

The reset switch RT is a transistor for erasing the generated signal charge, and the transfer switch TX is a transistor for transferring the generated signal charge. At the other end of the reset switch RT, a power supply voltage Vin, which is a reset voltage, is applied.

The reset switch RT is configured so that an RT control signal Srt for controlling the reset switch RT can be input, and the transfer switch TX is configured so that a TX control signal Stx for controlling the transfer switch TX can be input. Although not illustrated in FIGS. 6A and 6B, a color filter or a micro-lens can be formed on the light incident side of the photodiode PD.

The pixel circuit PIX is configured by including the reset switch RT, the transfer switch TX, and the amplifier SF. However, when a color filter and a micro-lens are to be provided, these are also included in the pixel circuit PIX.

<Example of Sharing a Control Signal Among a Plurality of the Pixels 2>

Next, an example of sharing of a control signal among a plurality of the pixels 2 according to the embodiment will be described with reference to FIG. 7.

Here, in the photoelectric conversion device 1, it would be preferable if the voltage signal level, at the time of full scale when the incident light is maximum, is matched among the pixel columns 2R, 2G, 2B, and 2IR. This is because, in this case, the signal processing circuits such as amplifier circuits for processing the voltage signals from the pixel columns 2R, 2G, 2B, and 2IR, can have the same configuration.

The adjustment for matching the voltage signal level among the pixel columns 2R, 2G, 2B, and 2IR, can be accomplished by controlling the storage time of light by the photodiode PD. In order to control the storage time of light by the photodiode PD, the RT control signal Srt and the TX control signal Stx are used.

Figure 7:
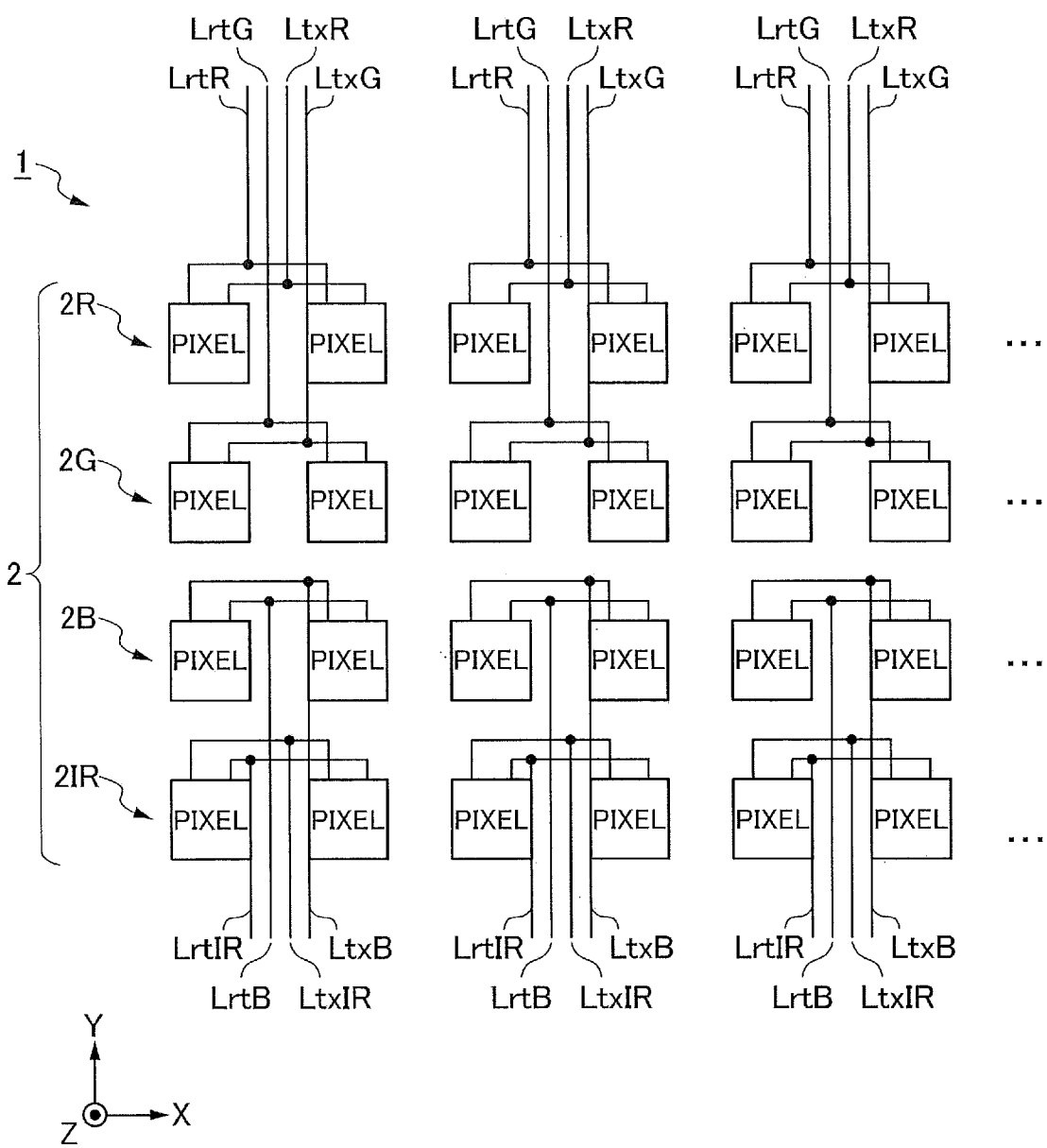
FIG. 7 is a diagram illustrating an example of a control signal supplied to each pixel circuit according to the first embodiment of the present invention.

FIG. 7 is a diagram illustrating an example of a control signal supplied to each pixel circuit PIX. In FIG. 7, similarly to FIG. 4, the photoelectric conversion device 1 is configured by arranging the four pixel columns 2R, 2G, 2B, and 2IR with respect to each other in the Y direction. Each of the pixel columns 2R, 2G, 2B, and 2IR includes the pixels 2 arranged in the X direction.

If the RT control signal Srt and the TX control signal Stx are supplied to each of the plurality of pixel circuits PIX along the X direction in which the pixels 2 forming the pixel column are arranged, the number of the transistors controlled by one control signal becomes several hundreds to several thousands, and sometimes tens of thousands, depending on the number of the pixels 2. Therefore, in this case, it may be difficult to uniformly drive all of the transistors.

Thus, it is preferable to supply the RT control signal Srt and the TX control signal Stx in the Y direction, which is the direction of reading the voltage signal of the pixel 2. However, when the RT control signal Srt and the TX control signal Stx are supplied for each pixel along the Y direction, the number of signal lines for supplying the signals increases. In this case, the opening area of the opening portion defining the amount of light incident on the photodiode PD will become small, and it may be difficult to read the voltage signal with high sensitivity.

On the other hand, in the embodiment, the control signal is shared among the plurality of pixels, and the RT control signal Srt and the TX control signal Stx are supplied for each combination of the plurality of pixels, so that the number of signal lines for supplying the RT control signal Srt and the TX control signal Stx is reduced. Accordingly, the opening area of the opening portion is increased, thereby enabling the voltage signal to be read with high sensitivity.

As illustrated in FIG. 7, in the pixel column 2R, the signal line LrtR supplies the RT control signal SrtR from the +Y direction side, and the signal line LtxR supplies the TX control signal StxR from the +Y direction side. The +Y direction side corresponds to the side from which the voltage signal is read from the pixel column 2R. The signal line LrtR and the signal line LtxR are each coupled to a plurality of the pixel circuits PIXR in the pixel column 2R.

In the pixel column 2G, the signal line LrtG supplies the RT control signal SrtG from the +Y direction side, and the signal line LtxG supplies the TX control signal StxG from the +Y direction side. The +Y direction side corresponds to the side from which the voltage signal is read from the pixel column 2G. The signal line LrtG and the signal line LtxG are each coupled to a plurality of the pixel circuits PIXG in the pixel column 2G.

In the pixel column 2B, the signal line LrtB supplies the RT control signal SrtB from the −Y direction side and the signal line LtxB supplies the TX control signal StxB from the −Y direction side. The −Y direction side corresponds to the side from which the voltage signal is read from the pixel column 2B. The signal line LrtB and the signal line LtxB are each coupled to a plurality of the pixel circuits PIXB in the pixel column 2B.

In the pixel column 2IR, the signal line LrtIR supplies the RT control signal SrtIR from the −Y direction side, and the signal line LtxIR supplies the TX control signal StxIR from the −Y direction side. The −Y direction side corresponds to the side from which the voltage signal is read from the pixel column 2IR. The signal line LrtIR and the signal line LtxIR are each coupled to a plurality of the pixel circuits PIXIR in the pixel column 2IR.

That is, the RT control signal SrtR for controlling the pixel circuit PIXR in the pixel column 2R, the RT control signal SrtG for controlling the pixel circuit PIXG in the pixel column 2G, the RT control signal SrtB for controlling the pixel circuit PIXB in the pixel column 2B, and the RT control signal SrtIR for controlling the pixel circuit PIXIR in the pixel column 2IR are different signals from each other.

Further, the TX control signal StxR for controlling the pixel circuit PIXR in the pixel column 2R, the TX control signal StxG for controlling the pixel circuit PIXG in the pixel column 2G, the TX control signal StxB for controlling the pixel circuit PIXB in the pixel column 2B, and the TX control signal StxIR for controlling the pixel circuit PIXIR in the pixel column 2IR are different signals from each other.

In this way, the control can be executed such that the storage time of the photodiode PD is equal for each color, and the signal process coupled to a later stage of the photoelectric conversion device 1 can be easily executed.

Here, the RT control signal SrtR and the TX control signal StxR are examples of "a control signal for the first circuit", and the RT control signal SrtG and the TX control signal StxG are examples of "a control signal for the second circuit". The RT control signal SrtB and the TX control signal StxB are examples of "a control signal for the third circuit", and the RT control signal SrtIR and the TX control signal StxIR are examples of "a control signal for the fourth circuit".

The signal line LrtR is coupled to the side (+Y direction side) from which the voltage signal of the pixel column 2R is read, the signal line LrtG is coupled to the side (+Y direction side) from which the voltage signal of the pixel column 2G is read, the signal line LrtB is coupled to the side (−Y direction side) from which the voltage signal of the pixel column 2B is read, and the signal line LrtIR is coupled to the side (−Y direction side) from which the voltage signal of the pixel column 2IR is read.

Further, the signal line LtxR is coupled to the side (+Y direction side) from which the voltage signal of the pixel column 2R is read, the signal line LtxG is coupled to the side (+Y direction side) from which the voltage signal of the pixel column 2G is read, the signal line LtxB is coupled to the side (−Y direction side) from which the voltage signal of the pixel column 2B is read, and the signal line LtxIR is coupled to the side (−Y direction side) from which the voltage signal of the pixel column 2IR is read.

In this way, the pixel circuits PIX of all of the pixels 2 can be driven as uniformly as possible.

The signal line LrtR is coupled to a plurality of pixel circuits PIXR, the signal line LrtG is coupled to a plurality of pixel circuits PIXG, the signal line LrtB is coupled to a plurality of pixel circuits PIXB, and the signal line LrtIR is coupled to a plurality of pixel circuits PIXIR.

Further, the signal line LtxR is coupled to a plurality of pixel circuits PIXR, the signal line LtxG is coupled to a plurality of pixel circuits PIXG, the signal line LtxB is coupled to a plurality of pixel circuits PIXB, and the signal line LtxIR is coupled to a plurality of pixel circuits PIXIR.

In this way, the pixel circuits PIX of all of the pixels 2 is driven as uniformly as possible, and the number of wires between the adjacent pixels 2 is reduced as much as possible so that the voltage signal can be read with high sensitivity.

Here, each of the signal lines LrtR and LtxR is an example of "the signal line that supplies the control signal to the first circuit", and each of the signal lines LrtG and LtxG is an example of "the signal line that supplies the control signal to the second circuit". Each of the signal lines LrtB and LtxB is an example of "the signal line that supplies the control signal to the third circuit", and each of the signal lines LrtIR and LtxIR is an example of "the signal line that supplies the control signal to the fourth circuit".

FIG. 7 illustrates an example in which the control signal is supplied to the two pixels 2 by one signal line. However, the embodiment is not limited thereto, and the control signal may be provided to a larger number of the pixels 2.

However, the thicker the signal line passed between the adjacent pixels 2, the smaller the opening area of the opening portion and the lower the sensitivity of reading the voltage signal, and, therefore, it is preferable that the signal line is as thin as possible. However, if the signal line is too thin, the wiring resistance increases, and the pixels 2 cannot be driven uniformly. Accordingly, it is preferable to configure a signal line to have a thickness capable of driving a number of the pixels 2 ranging from approximately a few pixels to a few tens of pixels.

<Example of Wiring Between a Plurality of the Pixels 2>

Figure 8:
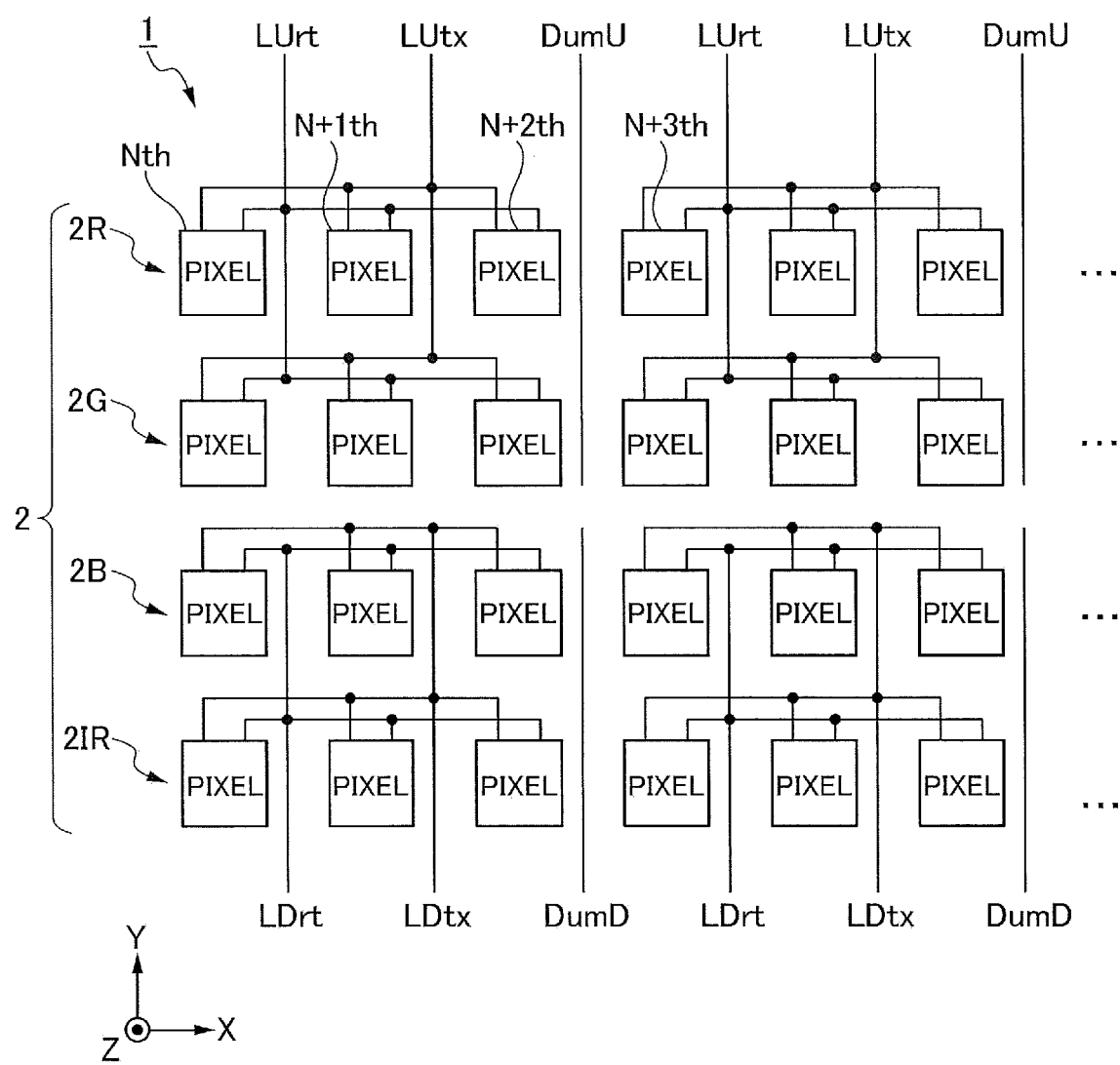
FIG. 8 is a diagram illustrating an example of wiring between a plurality of pixels according to the first embodiment of the present invention.

Next, the wiring between a plurality of the pixels 2 will be described with reference to FIG. 8. FIG. 8 is a diagram illustrating an example of the wiring between a plurality of the pixels 2.

Here, the variation in the sensitivity of reading the voltage signal of each of the pixels 2 along the X direction in which the pixels 2 are arranged, causes an increase in the Photo Response Non Uniformity (PRNU) in the photoelectric conversion device 1. The PRNU refers to the variation in sensitivity of the respective pixels with respect to an equivalent amount of light incident on the photoelectric conversion device.

In the embodiment, as illustrated in FIG. 8, among the pixels 2 arranged in the X direction, for example, a signal line LUrt for supplying the RT control signal Srt is passed between the Nth and N+1th pixels, a signal line LUtx for supplying the TX control signal Stx is passed between the N+1th and N+2th pixels, and a signal line DumU for supplying a dummy signal is passed between the N+2th and N+3th pixels. The dummy signal can be a power signal for the reset switch RT or a power signal for the amplifier SF, etc.

Note that the Nth to N+3th pixels 2 are illustrated herein. However, signal lines can be similarly passed between the other pixels 2 arranged in the X direction. Further, the signal lines LDrt, LDtx, and DumD on the −Y direction side can be similarly passed between the pixels 2.

This configuration allows the number of signal lines between the adjacent pixels 2 to be equal between all of the pixels 2. That is, the number of signal lines that supply the control signal for the pixel circuit PIXR between adjacent pixels in the pixel column 2R, the number of signal lines that supply the control signal for the pixel circuit PIXG between adjacent pixels in the pixel column 2G, the number of signal lines that supply the control signal for the pixel circuit PIXB between adjacent pixels in the pixel column 2B, and the number of signal lines that supply the control signal for the pixel circuit PIXIR between adjacent pixels in the pixel column 2IR, are all equal.

In this way, the opening areas of the opening portions can be made equal, and the variation in the sensitivity among the respective pixels 2 can be reduced.

FIG. 8 illustrates an example in which the signal lines LUrt and LUtx are shared by six pixels in the pixel columns 2R and 2G and the signal lines LDrt and LDtx are shared by six pixels in the pixel columns 2B and 2IR. However, the signal lines LUrt and LUtx to be shared may be separated according to each color. That is, three pixels of the pixel column 2R may share the signal lines LUrt and LUtx, and three pixels of the pixel column 2G may share the signal lines LUrt and LUtx. This allows the sensitivity to be equalized among different colors, by varying the storage time for each color. Even in this case, it is preferable to equalize the number of signal lines between the pixels 2.

<Example of Coupling Between the Photoelectric Conversion Device 1 and the Signal Processing Circuit at a Later Stage>

Figure 9B:
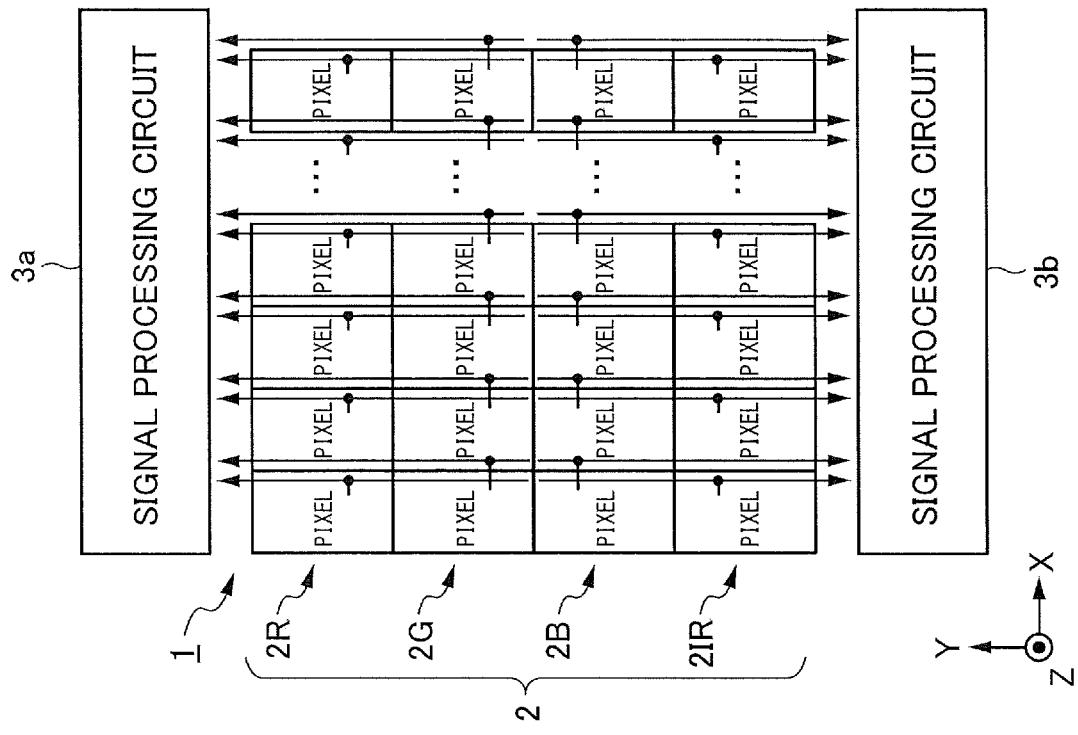
Figure 9A:
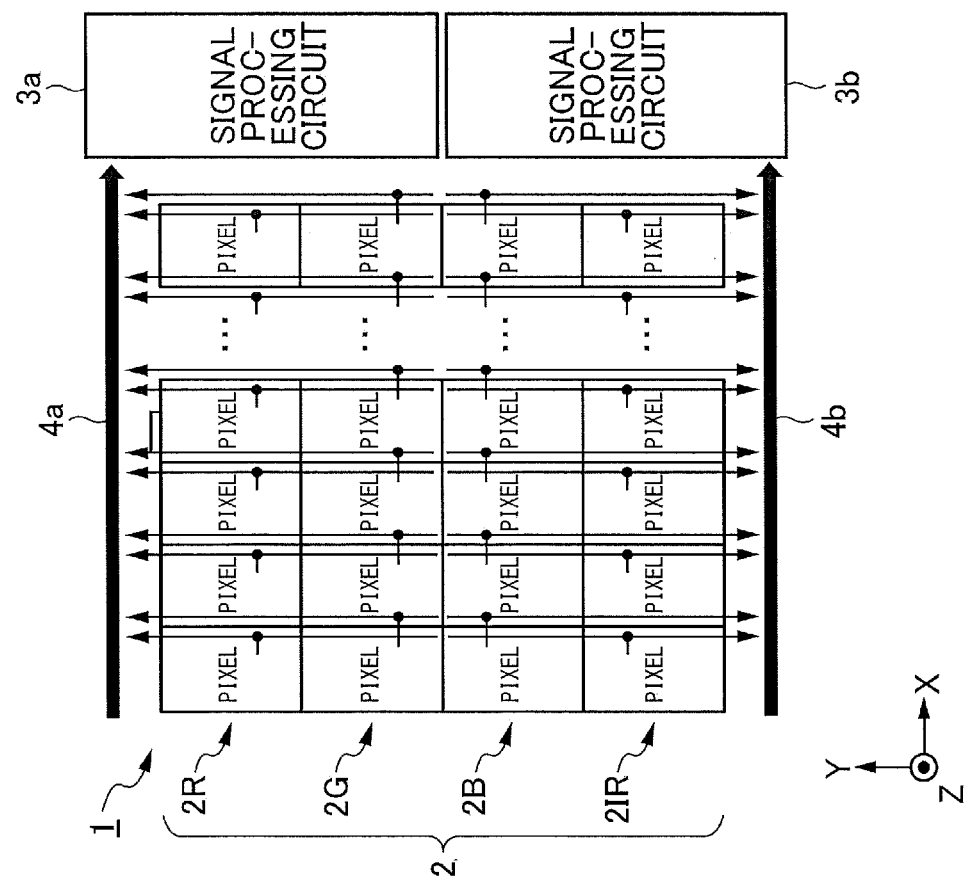

Next, the coupling between the photoelectric conversion device 1 and the signal processing circuit at a later stage will be described with reference to FIGS. 9A and 9B. FIGS. 9A and 9B are diagrams for describing an example of the coupling between the photoelectric conversion device 1 and the signal processing circuit at a later stage, wherein FIG. 9A is a diagram illustrating the coupling according to a comparison example, and FIG. 9B is a diagram illustrating the coupling according to an embodiment.

In FIG. 9A, signal processing circuits 3a and 3b are arranged side by side in the Y direction, on the +X direction side of the photoelectric conversion device 1, and each of the signal processing circuits 3a and 3b is electrically coupled to the photoelectric conversion device 1. The voltage signals of the pixel columns 2R and 2G are read from the +Y direction side and are transmitted to the signal processing circuit 3a through a signal line 4a. The voltage signals of the pixel columns 2B and 2IR are read from the −Y direction side and are transmitted to the signal processing circuit 3b through a signal line 4b.

In this case, because the number of the pixels 2 is hundreds to tens of thousands, the transmission distance until the voltage signals read at the photoelectric conversion device 1 reach the signal processing circuits 3a and 3b, is extremely long. Accordingly, the wiring resistance and parasitic capacitance may increase and the voltage value of the voltage signal may decrease, etc., which may result in the inability to transmit the voltage signal appropriately.

For this reason, as illustrated in FIG. 9B, it is preferable that the signal processing circuits 3a and 3b are disposed one on either side of the photoelectric conversion device 1, in the Y direction intersecting the X direction in which the pixels 2 are arranged. In FIG. 9B, the signal processing circuit 3a is provided on the +Y direction side of the photoelectric conversion device 1, and the photoelectric conversion device 1 and the signal processing circuit 3a are electrically coupled to each other. The signal processing circuit 3b is provided on the −Y direction side of the photoelectric conversion device 1, and the photoelectric conversion device 1 and the signal processing circuit 3b are electrically coupled to each other.

In this way, the transmission distance of the voltage signal read by the photoelectric conversion device 1 can be shortened, and the voltage signal can be appropriately transmitted to the signal processing circuits 3a and 3b while reducing the influence of the wiring resistance and the parasitic capacity.

Further, it is preferable that the signal processing circuits 3a and 3b, which are disposed one on either side of the photoelectric conversion device 1 in the Y direction, are circuits having the same configuration. By making these circuits have the same configuration, the circuit characteristics can be made common, and the input characteristics of the voltage signals from the photoelectric conversion device 1 to the signal processing circuits 3a and 3b and the signal processing characteristics of the signal processing circuits 3a and 3b can be equalized.

<Example of Rolling Method of a Plurality of the Pixels 2>

Next, a method of rolling the voltage signals of a plurality of the pixels 2 in the photoelectric conversion device 1 will be described with reference to FIGS. 10A to 10C. Here, the rolling in the photoelectric conversion device means the control for reading the voltage signal of each pixel in a pixel column.

FIGS. 10A to 10C are diagrams for describing an example of a rolling method of a plurality of the pixels 2, wherein FIG. 10A is a diagram illustrating an example of an arrangement of the pixels 2, FIG. 10B is a diagram illustrating a rolling method according to a comparison example, and FIG. 10C is a diagram illustrating an example of a rolling method according to an embodiment.

As illustrated in FIG. 10A, it is assumed that pixels 2a, 2b, 2c, 2d, 2e, and 2f among the pixels 2 are arranged along the X direction.

In FIG. 10B, an RT control signal Srt0 for each of the pixels 2a, 2b, and 2c and an RT control signal Srt1 for each of the pixels 2d, 2e, and 2f are input at the same time. Also to other pixels in the pixel column, the RT control signals Srt are input at the same time. Accordingly, the voltage signals of the pixels 2a, 2b, 2c, 2d, 2e, and 2f are read at the same time.

However, in the method of FIG. 10B, all of the pixels among the pixels 2 are controlled at the same time, and, therefore, a very large-scale signal processing circuit is required to be coupled to the later stage of the photoelectric conversion device. As the area of the signal processing circuit increases, the cost of the signal processing circuit may increase.

Therefore, as illustrated in FIG. 10C, it is preferable that the timing of instructing an operation to the pixel circuit PIX of the pixel 2 by a control signal, is different for each of a plurality of control signals. In FIG. 10C, first, the RT control signal Srt0 instructs an operation for each pixel circuit of the pixels 2a, 2b, and 2c, and then subsequently, the RT control signal Srt1 instructs an operation for each pixel circuit of the pixels 2d, 2e, and 2f. The pixel circuits of the pixels 2a, 2b, 2c, 2d, 2e, and 2f operate in response to instructions by the RT control signals Srt0 and Srt1, and the voltage signals of the pixels 2a, 2b, 2c, 2d, 2e, and 2f are read according to these operations.

For the pixel circuits of the other pixels in the pixel column, a plurality of RT control signals Srt instruct operations at timings different from each other. Also, with respect to the pixel circuits of the pixel columns 2R, 2G, 2B, and 2IR constituting the photoelectric conversion device 1, the plurality of RT control signals Srt instruct operations at different timings from each other. Furthermore, a plurality of TX control signals Stx instruct operations to the pixel circuits of the pixel columns 2R, 2G, 2B, and 2IR at different timings from each other.

The pixel circuits of the pixels 2a, 2b, 2c, 2d, 2e, and 2f operate in response to an instruction by the RT control signal Srt or the TX control signal Stx, and the voltage signals of the pixels 2a, 2b, 2c, 2d, 2e, and 2f are read by these operations.

That is, each of the plurality of pixel circuits PIXR operate at a different timing in response to the RT control signal Srt or the TX control signal Stx, and each of the plurality of pixel circuits PIXG operate at a different timing in response to the RT control signal Srt or the TX control signal Stx. Each of the plurality of pixel circuits PIXB operate at a different timing in response to the RT control signal Srt or the TX control signal Stx, and each of the plurality of pixel circuits PIXIR operate at a different timing in response to the RT control signal Srt or the TX control signal Stx.

In this way, the area of the signal processing circuit coupled to the later stage of the photoelectric conversion device 1 can be reduced, and the cost of the signal processing circuit can be prevented from increasing.

<Effect of Operation of the Photoelectric Conversion Device 1>

As described above, in the present embodiment, the photoelectric conversion device 1 is configured such that, among the pixel columns 2R, 2G, 2B, and 2IR, the direction of reading of the voltage signals from the pixel columns 2R and 2G is different from the direction of reading of the voltage signals from the pixel columns 2B and 2IR.

For example, the pixel columns 2R, 2G, 2B, and 2IR are arranged with respect to each other in the Y direction, and the direction of reading the voltage signals from the pixel columns 2R and 2G and the direction of reading the voltage signals from the pixel columns 2B and 2IR are configured to be opposite directions to each other in the Y direction.

In this way, the number of signal lines for transmitting voltage signals between adjacent pixels in each of the pixel columns 2R, 2G, 2B, and 2IR is reduced, and the area occupied by the metal wiring portion 122 is reduced. Thus, the opening area of the opening portion formed by the signal lines between adjacent pixels can be increased. Accordingly, the amount of light that passes through the opening portion of each of the pixels 2 and that is incident on the photodiode PD can be increased, and the voltage signal can be read from each of the pixels 2 with high sensitivity.

Note that the direction of reading the voltage signals from the pixel columns 2R and 2G and the direction of reading the voltage signals from the pixel columns 2B and 2IR are not limited to being in opposite directions in the Y direction, and as long as the directions are different, the aforementioned effect can be obtained.

In the present embodiment, the pixel column 2R is disposed closer to one end of the photoelectric conversion device 1 than the pixel column 2G in the Y direction, and the signal line for reading the voltage signal of the pixel column 2R is provided so as to extend from the position where the pixel column 2G is disposed to the above-described one end in the Y direction. The pixel column 2IR is disposed closer to the other end of the photoelectric conversion device 1 than the pixel column 2B in the Y direction, and the signal line for reading the voltage signal of the pixel column 2IR is provided so as to extend from the position where the pixel column 2B is disposed to the above-described other end in the Y direction.

In this way, two signal lines can be passed through at the position of the pixel column 2G as well, and, therefore, the number of signal lines between adjacent pixels in the pixel column 2R and the number of signal lines between adjacent pixels in the pixel column 2G can be equal to each other. Further, two signal lines can be passed through at the position of the pixel column 2B as well, and, therefore, the number of signal lines between adjacent pixels in the pixel column 2IR and the number of signal lines between adjacent pixels in the pixel column 2B can be equal to each other.

By equalizing the number of signal lines between adjacent pixels for each color, the area occupied by the signal lines between adjacent pixels for each color can be equalized, thereby equalizing the size of the opening portion (the opening area) for each color and equalizing the sensitivity of reading the voltage signal for each color.

In the present embodiment, the RT control signal SrtR for controlling the pixel circuit PIXR in the pixel column 2R, the RT control signal SrtG for controlling the pixel circuit PIXG in the pixel column 2G, the RT control signal SrtB for controlling the pixel circuit PIXB in the pixel column 2B, and the RT control signal SrtIR for controlling the pixel circuit PIXIR in the pixel column 2IR, are different signals from each other.

The TX control signal StxR for controlling the pixel circuit PIXR in the pixel column 2R, the TX control signal StxG for controlling the pixel circuit PIXG in the pixel column 2G, the TX control signal StxB for controlling the pixel circuit PIXB in the pixel column 2B, and the TX control signal StxIR for controlling the pixel circuit PIXIR in the pixel column 2IR, are different signals from each other.

Thus, the control can be executed such that the storage time of the photodiode PD is equal for each color, and the signal process coupled to the later stage of the photoelectric conversion device 1 can be easily executed.

In the present embodiment, the signal line LrtR is coupled to the side from which the voltage signal is read from the pixel column 2R, the signal line LrtG is coupled to the side from which the voltage signal is read from the pixel column 2G, the signal line LrtB is coupled to the side from which the voltage signal is read from the pixel column 2B, and the signal line LrtIR is coupled to the side from which the voltage signal is read from the pixel column 2IR.

Furthermore, the signal line LtxR is coupled to the side from which the voltage signal is read from the pixel column 2R, the signal line LtxG is coupled to the side from which the voltage signal is read from the pixel column 2G, the signal line LtxB is coupled to the side from which the voltage signal is read from the pixel column 2B, and the signal line LtxIR is coupled to the side from which the voltage signal is read from the pixel column 2IR.

In this way, the pixel circuits PIX of all of the pixels 2 can be driven as uniformly as possible.

In the present embodiment, the signal line LrtR is coupled to a plurality of pixel circuits PIXR, the signal line LrtG is coupled to a plurality of pixel circuits PIXG, the signal line LrtB is coupled to a plurality of pixel circuits PIXB, and the signal line LrtIR is coupled to a plurality of pixel circuits PIXIR.

Furthermore, the signal line LtxR is coupled to a plurality of pixel circuits PIXR, the signal line LtxG is coupled to a plurality of pixel circuits PIXG, the signal line LtxB is coupled to a plurality of pixel circuits PIXB, and the signal line LtxIR is coupled to a plurality of pixel circuits PIXIR.

In this way, the pixel circuits PIX of all of the pixels 2 can be driven as uniformly as possible, and the number of wires between the adjacent pixels 2 can be reduced as much as possible to perform the reading of the voltage signal with high sensitivity.

In the present embodiment, the number of signal lines that supply the control signal for the pixel circuit PIXR between adjacent pixels in the pixel column 2R, the number of signal lines that supply the control signal for the pixel circuit PIXG between adjacent pixels in the pixel column 2G, the number of signal lines that supply the control signal for the pixel circuit PIXB between adjacent pixels in the pixel column 2B, and the number of signal lines that supply the control signal for the pixel circuit PIXIR between adjacent pixels in the pixel column 2IR, are all equal to each other.

In this way, the opening area of the opening portion can be equal, and the variation in the sensitivity among the pixels 2 can be reduced.

In the present embodiment, the signal processing circuits 3a and 3b are disposed one on either side of the photoelectric conversion device 1 in the Y direction. Therefore, the transmission distance of the voltage signal read at the photoelectric conversion device 1 can be shortened, and the voltage signal can be appropriately transmitted to the signal processing circuits 3a and 3b while reducing the influence of the wiring resistance and the parasitic capacity.

In the present embodiment, the signal processing circuits 3a and 3b, which are disposed one on either side of the photoelectric conversion device 1 in the Y direction, have the same configuration. Thus, the circuit characteristics can be made common, and the input characteristics of the voltage signals from the photoelectric conversion device 1 to the signal processing circuits 3a and 3b and the signal processing characteristics of the signal processing circuits 3a and 3b can be equalized.

In the present embodiment, each of the plurality of pixel circuits PIXR operates at a different timing in response to the RT control signal Srt or the TX control signal Stx, and each of the plurality of pixel circuits PIXG operates at a different timing in response to the RT control signal Srt or the TX control signal Stx. Each of the plurality of pixel circuits PIXB operates at a different timing in response to the RT control signal Srt or the TX control signal Stx, and each of the plurality of pixel circuits PIXIR operates at a different timing in response to the RT control signal Srt or the TX control signal Stx.

In this way, the area of the signal processing circuit coupled to the later stage of the photoelectric conversion device 1 can be reduced, and the cost of the signal processing circuit can be prevented from increasing.

Second Embodiment

Figure 11A:
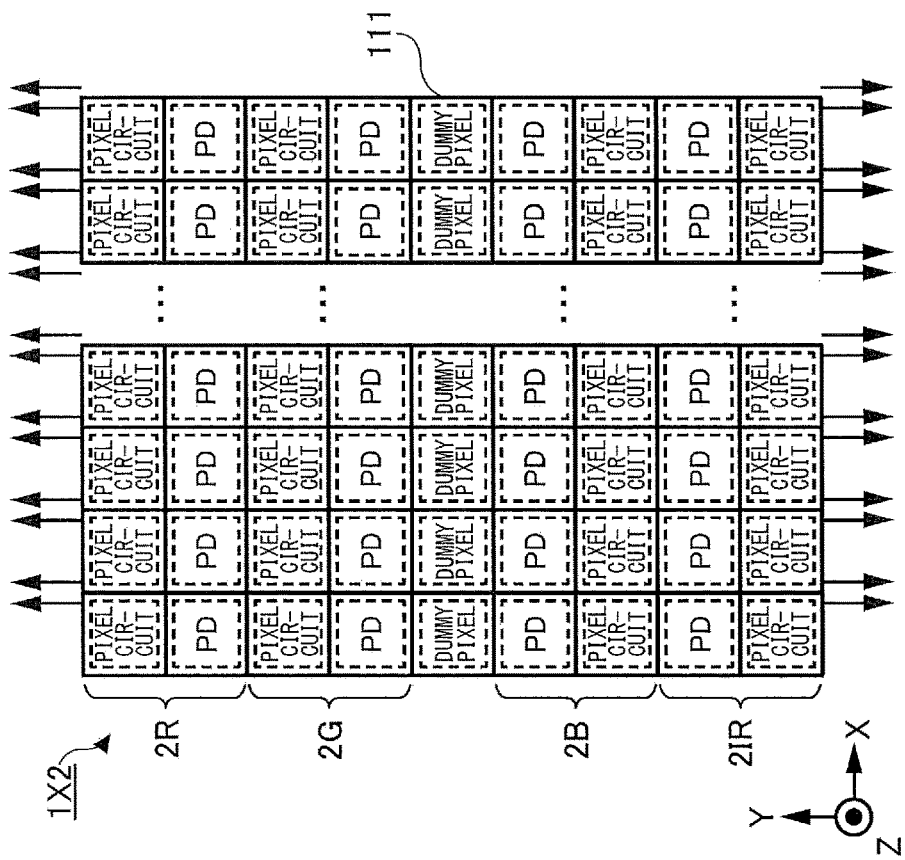
Figure 11B:
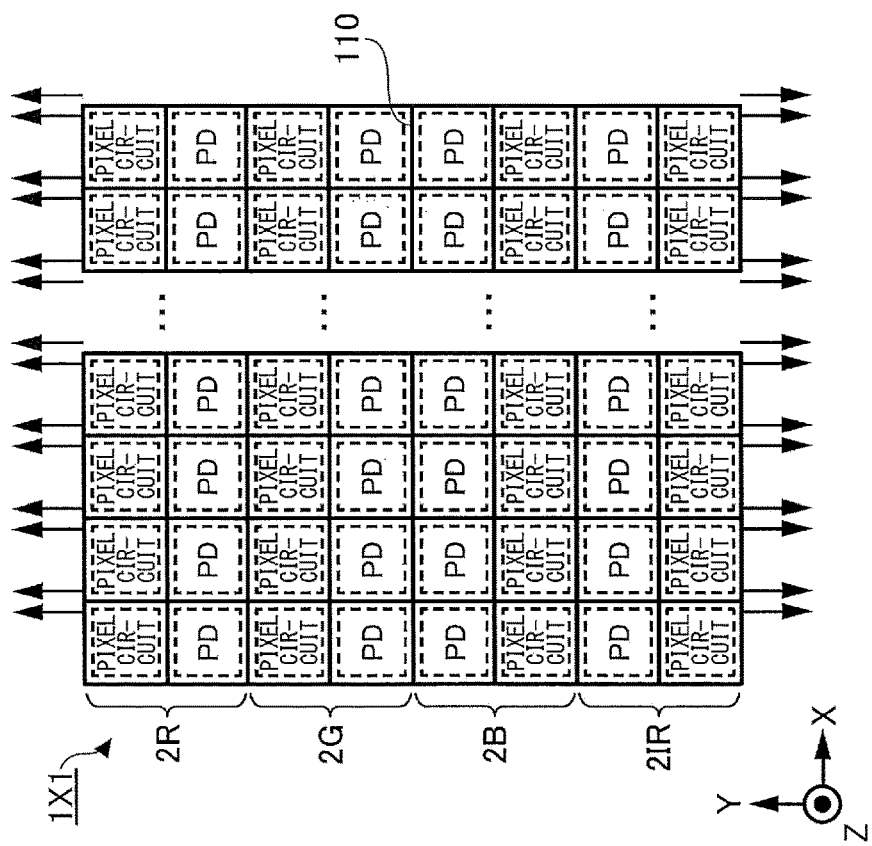
Figure 11D:
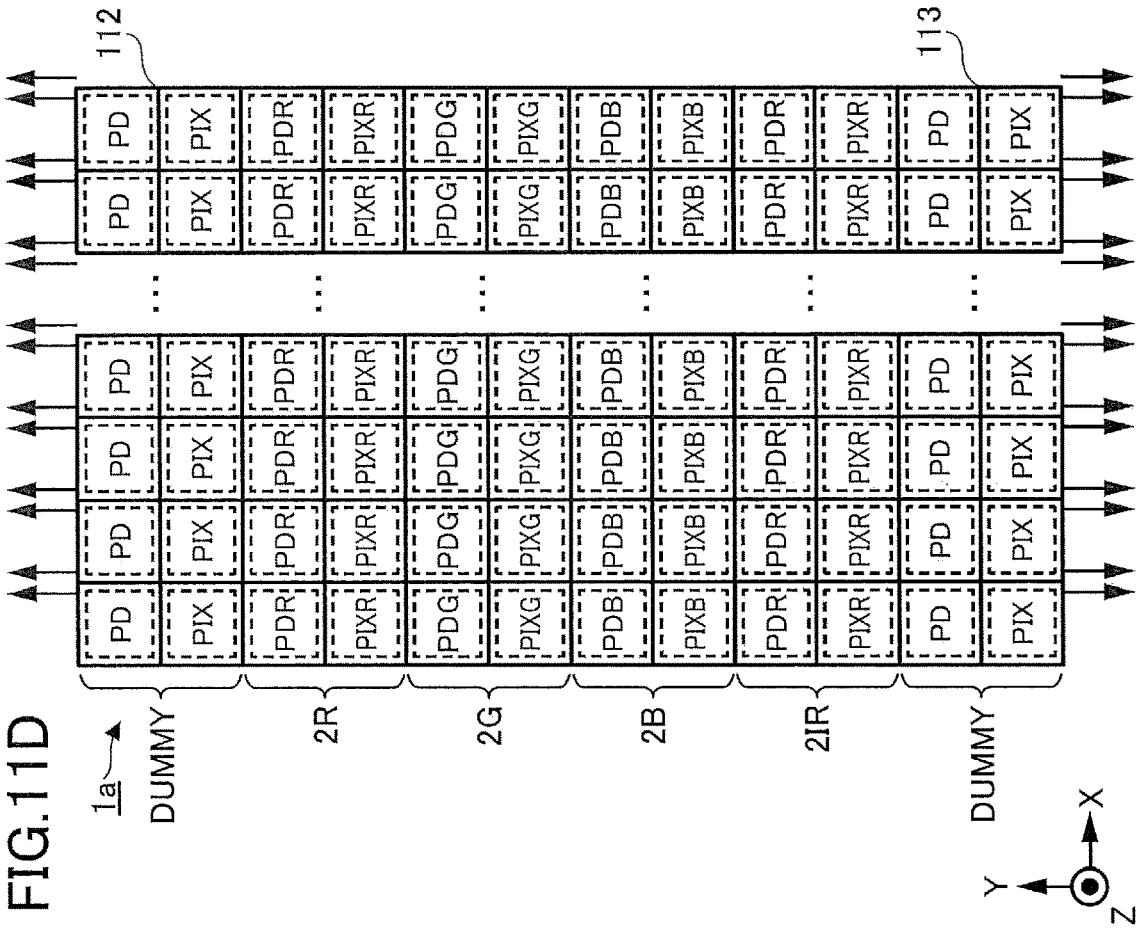
Figure 11C:
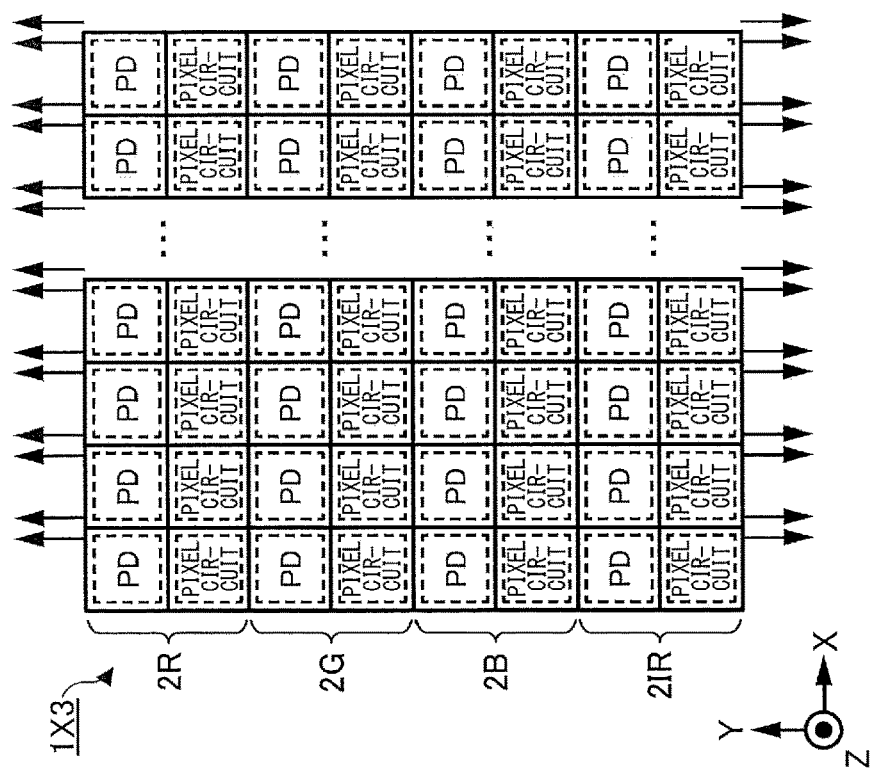

Next, a photoelectric conversion device 1a according to the second embodiment will be described with reference to FIGS. 11A to 11D. FIGS. 11A to 11D are diagrams for describing an example of disposing the photodiode PD and the pixel circuit PIX according to the second embodiment, wherein FIG. 11A is a diagram illustrating the disposition of a first comparison example, FIG. 11B is a diagram illustrating the disposition of a second comparison example, FIG. 11C is a diagram illustrating the disposition of a third comparison example, and FIG. 11D is a diagram illustrating the disposition of the present embodiment.

In a photoelectric conversion device 1X1 illustrated in FIG. 11A, the pixel columns 2R and 2G and the pixel columns 2B and 2IR are symmetrically disposed in the Y direction with a border 110 between the pixel columns 2G and 2B as the symmetrical axis.

In this case, the column spacing between the photodiodes PD that perform the photoelectric conversion corresponds to two columns between the pixel column 2R and the pixel column 2G, the column spacing corresponds to one column between the pixel column 2G and the pixel column 2B, and the column spacing corresponds to two columns between the pixel column 2B and the pixel column 2IR. Accordingly, the column spacing is not consistent among the respective colors, and, therefore, a positional displacement between the pixel columns may occur when the photoelectric conversion device 1X1 is manufactured.

In a photoelectric conversion device 1X2 of FIG. 11B, a dummy pixel column 111 corresponding to one column is provided between the pixel column 2G and the pixel column 2B. Here, a dummy pixel column means a pixel column that does not use a voltage signal.

In this way, the column spacing can be made consistent among the respective colors. However, in this disposition, the direction of disposing the pixel circuit PIX with respect to the photodiode PD is reversed in the Y direction, between the pixel columns 2R and 2G and the pixel columns 2B and IR. For example, in the pixel columns 2R and 2G, the pixel circuit PIX is disposed on the +Y direction side of the photodiode PD, whereas in the pixel columns 2B and 2IR, the pixel circuit PIX is disposed on the −Y direction side of the photodiode PD.

When the photoelectric conversion device 1X2 is manufactured by a semiconductor process with this disposition, the pixel columns 2R and 2G will have different characteristics from those of the pixel columns 2B and IR. Accordingly, it is preferable that the direction of disposing the pixel circuit PIX with respect to the photodiode PD is the same for each color.

A photoelectric conversion device 1X3 illustrated in FIG. 11c is formed by removing the dummy pixel column 111 from the photoelectric conversion device 1X2, and making the direction of. disposing the pixel circuit PIX with respect to the photodiode PD to be the same for each color. However, in the photoelectric conversion device 1X3, the semiconductor process is affected by the surrounding layout, and, therefore, the characteristics of the repetitive patterns and the end regions of the repetitive patterns may vary.

In view of the above, in the present embodiment, the pixel circuit PIX is disposed with respect to the photodiode PD in the same direction for each color, a dummy pixel column 112 is provided on the +Y direction side of the pixel column 2R, and a dummy pixel column 113 is provided on the −Y direction side of the pixel column 2IR.

That is, the direction of disposing the pixel circuit PIXR with respect to the photodiode PDR, the direction of disposing the pixel circuit PIXG with respect to the photodiode PDG, the direction of disposing the pixel circuit PIXB with respect to the photodiode PDB, and the direction of disposing the pixel circuit PIXIR with respect to the photodiode PDIR, are all the same.

The pixel column 2R is adjacent to the pixel column 2G and the dummy pixel column 112, the pixel column 2G is adjacent to the pixel column 2R and the pixel column 2B, the pixel column 2B is adjacent to the pixel column 2G and the pixel column 2IR, and the pixel column 2IR is adjacent to the pixel column 2B and the dummy pixel column 113.

Here, the dummy pixel column 112 is an example of "first simulation pixel column", and the dummy pixel column 113 is an example of "second simulation pixel column".

In this configuration, by making the column spacing consistent among the respective colors, it is possible to prevent a positional displacement between the pixel columns in the manufacturing process of the photoelectric conversion device 1a. Further, the direction of disposing the pixel circuit PIX with respect to the photodiode PD can be the same for each color, so that the characteristics of the pixel column 2R, 2G, 2B, and 2IR can be equalized. Further, the dummy pixel columns 112 and 113 are disposed at the end portions, and, therefore, the photoelectric conversion device 1a is prevented from being affected by changes in the characteristics at the end portions thereof.

The effects other than the above are the same as those described in the first embodiment.

Third Embodiment

Next, an image reading apparatus 100 according to the third embodiment will be described with reference to FIG. 12. Here, the image reading apparatus 100 is an apparatus such as a scanner or the like for reading a document image.

Figure 12:
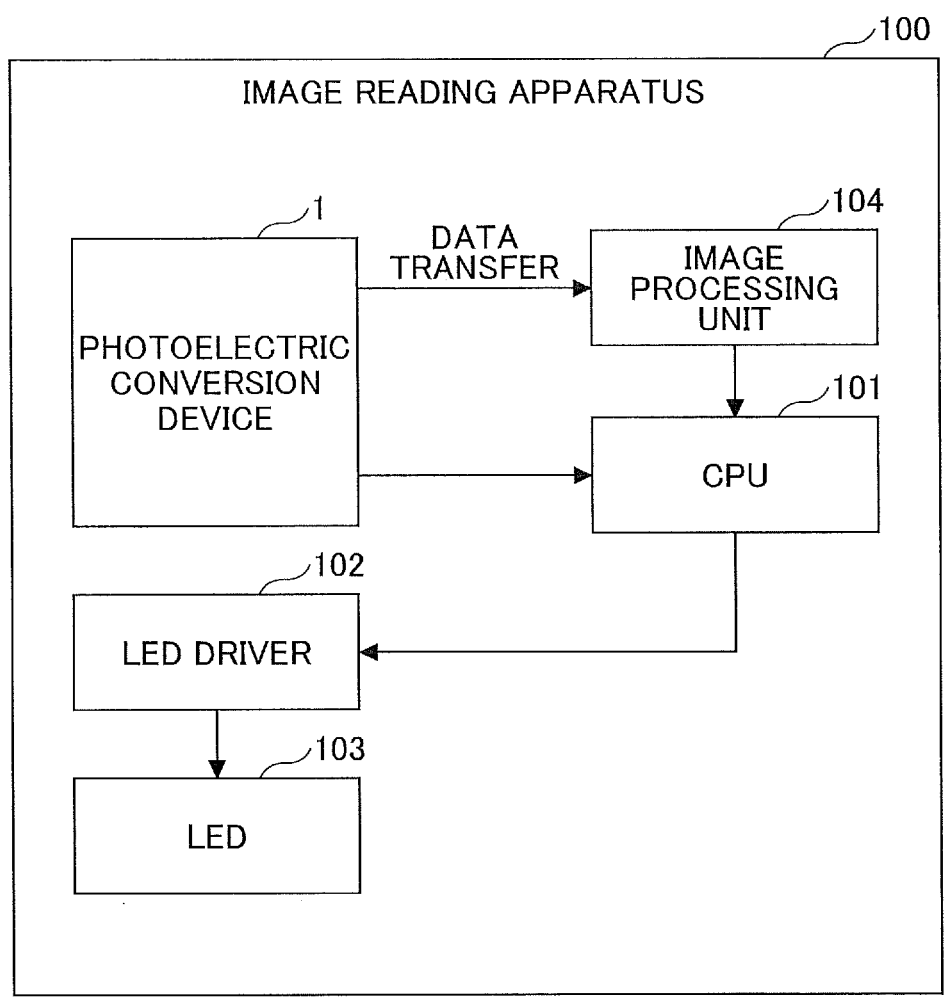
FIG. 12 is a block diagram illustrating an example of a configuration of an image reading apparatus according to a third embodiment of the present invention.

FIG. 12 is a block diagram illustrating an example of a configuration of the image reading apparatus 100. As illustrated in FIG. 12, the image reading apparatus 100 includes the photoelectric conversion device 1, a central processing unit (CPU) 101, a Light Emitting Diode (LED) driver 102, an LED 103, and an image processing unit 104.

The photoelectric conversion device 1 receives light reflected from a document that is the light irradiated by the LED 103, and transfers the received light signal as the image data obtained by reading the document, to the image processing unit 104.

The CPU 101 is a processor that controls the entire image reading apparatus 100. The LED driver 102 is an electronic circuit that drives the LED 103 under the control of the CPU 101 to irradiate light to a document, such as a paper.

The image processing unit 104 is an electronic circuit that executes various correction processes with respect to image data transferred from the photoelectric conversion device 1.

As described above, by including the photoelectric conversion device 1, it is possible to provide the image reading apparatus 100 capable of reading a voltage signal from a pixel with high sensitivity and reading a high-quality image.

Fourth Embodiment

Next, an image forming apparatus 200 according to the fourth embodiment will be described. Here, the image forming apparatus 200 is an apparatus such as a Multifunction Peripheral/Printer/Product (MFP) or a printer that forms an image on a recording medium such as a paper.

Figure 13:
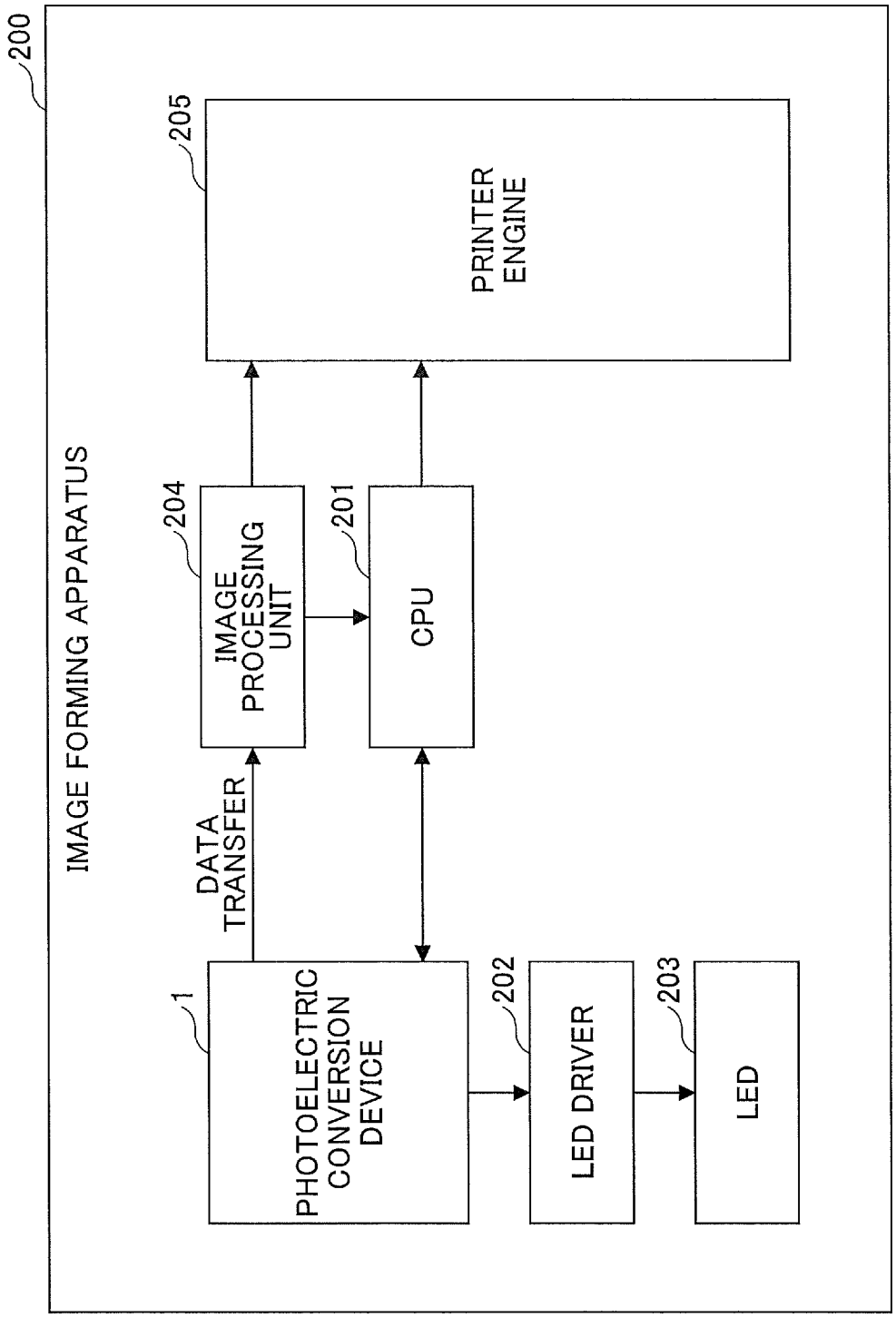
FIG. 13 is a block diagram illustrating an example of a configuration of an image forming apparatus according to a fourth embodiment of the present invention.

FIG. 13 is a block diagram illustrating an example of the configuration of the image forming apparatus 200. As illustrated in FIG. 13, the image forming apparatus 200 includes the photoelectric conversion device 1, a CPU 201, an LED driver 202, an LED 203, an image processing unit 204, and a printer engine 205.

The photoelectric conversion device 1 receives light reflected from a document that is the light irradiated by the LED 203 and transfers the received light signal as the image data obtained by reading the document, to the image processing unit 204.

The CPU 201 is a processor that controls the entire image forming apparatus 200. The LED driver 202 is an electronic circuit that drives the LED 203 under the control of the CPU 201 to irradiate light to a document, such as a paper.

The image processing unit 204 is an electronic circuit that executes various correction processes with respect to image data transferred from the photoelectric conversion device 1.

In the printer engine 205, image data read by the photoelectric conversion device 1 is input via the image processing unit 204. The printer engine 205 is an engine unit that forms an image on a recording medium based on the image data under the control of the CPU 201.

As described above, by including the photoelectric conversion device 1, it is possible to provide the image forming apparatus 200 capable of reading a voltage signal from a pixel with high sensitivity and forming the read high-quality image on a recording medium.

Fifth Embodiment

Next, a camera system 300 (imaging system) according to the fifth embodiment will be described. Here, the camera system 300 is a system such as a digital camera or a video camera.

Figure 14:
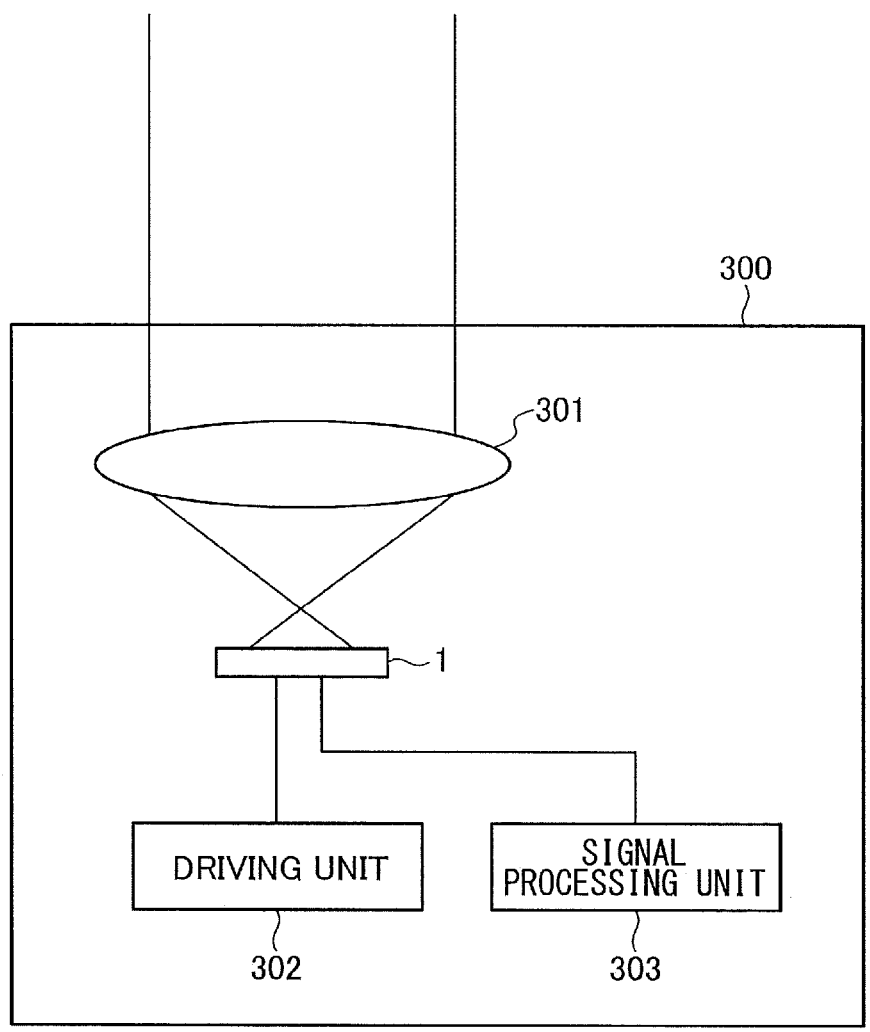
FIG. 14 is a diagram illustrating an example of a configuration of a camera system according to a fifth embodiment of the present invention.

FIG. 14 is a diagram illustrating an example of a configuration of the camera system 300.

As illustrated in FIG. 14, the camera system 300 includes the photoelectric conversion device 1, a lens 301, a driving unit 302, and a signal processing unit 303.

The lens 301 forms an image of a subject on the photodiode PD of the photoelectric conversion device 1. The photoelectric conversion device 1 outputs an image signal obtained by imaging the formed image of the subject.

The driving unit 302 includes a timing generator for driving a circuit in the photoelectric conversion device 1, and drives the photoelectric conversion device 1 with a predetermined timing signal.

The signal processing unit 303 executes a predetermined signal process with respect to the image signal output by the photoelectric conversion device 1. When the image signal processed by the signal processing unit 303 is an analog signal, the image signal is stored as image information in a storage device such as a memory via an analog-to-digital conversion circuit (AFE; Analog Front End). When the image signal processed by the signal processing unit 303 is a digital signal, the image signal is stored as image information in a storage device such as a memory via a digital signal processing circuit (DFE; Digital Front End).

The image information stored in the storage device can be copied in a hardware-manner by a printer or the like. The image signal processed by the signal processing unit 303 can be displayed as a video on a monitor such as a liquid crystal display.

As described above, by including the photoelectric conversion device 1, it is possible to provide the camera system 300 capable of reading a voltage signal from a pixel with high sensitivity and imaging a high-quality image.

According to one embodiment of the present invention, voltage signals can be read from pixels with high sensitivity.

The photoelectric conversion device and the image forming apparatus are not limited to the specific embodiments described in the detailed description, and variations and modifications may be made without departing from the spirit and scope of the present invention.

What is claimed is:

1. A photoelectric conversion device comprising:
   a first pixel column that comprises a plurality of pixels disposed in a predetermined direction, wherein each pixel of the plurality of pixels of the first pixel column comprises:
      a first photoelectric conversion element configured to receive light of a first wavelength region and generate a signal charge; and
      a first circuit configured to, convert the signal charge generated by the first photoelectric conversion element into a voltage signal;
   a second pixel column that comprises a plurality of pixels disposed in the predetermined direction, wherein each pixel of the plurality of pixels of the second pixel column comprises:
      a second photoelectric conversion element configured to receive light of a second wavelength region and generate a signal charge; and
      a second circuit configured to convert the signal charge generated by the second photoelectric conversion element into a voltage signal;
   a third pixel column that comprises a plurality of pixels are arranged disposed in the predetermined direction, wherein each pixel of the plurality of pixels of the third pixel column comprises:
      a third photoelectric conversion element configured to receive light of a third wavelength region and generate a signal charge; and
      a third circuit configured to convert the signal charge generated by the third photoelectric conversion element into a voltage signal; and
   a fourth pixel column that comprises a plurality of pixels disposed in the predetermined direction, wherein each pixel of the plurality of pixels of the fourth pixel column comprises:
      a fourth photoelectric conversion element configured to receive light of a fourth wavelength region and generate a signal charge; and
      a fourth circuit, configured to convert the signal charge generated by the fourth photoelectric conversion element into a voltage signal, wherein
   directions of reading voltage signals from the first pixel column and the second pixel column are different from directions of reading the voltage signals from the third pixel column and the fourth pixel column,
   the first pixel column is disposed closer to a first end of the photoelectric conversion device than is the second pixel column in a direction intersecting the predetermined direction,
   a signal line for reading the voltage signal from the first pixel column is disposed so as to extend from a position where the second pixel column is disposed to the first end in the direction intersecting the predetermined direction,
   the fourth pixel column is disposed closer to a second end of the photoelectric conversion device than is the third pixel column in the direction intersecting the predetermined direction, and
   a signal line for reading the voltage signal from the fourth pixel column is disposed so as to extend from a position where the third pixel column is disposed to the second end in the direction intersecting the predetermined direction.

2. The photoelectric conversion device according to claim 1, wherein
   the first pixel column, the second pixel column, the third pixel column, and the fourth pixel column are arranged with respect to each other in a direction intersecting the predetermined direction, and
   the direction of reading the voltage signal from each of the first pixel column and the second pixel column and the direction of reading the voltage signal from each of the third pixel column and the fourth pixel column are opposite directions to each other in the direction intersecting the predetermined direction.

3. The photoelectric conversion device according to claim 1, wherein
   the first wavelength region includes at least a wavelength region corresponding to red;
   the second wavelength region includes at least a wavelength region corresponding to geen;
   the third wavelength region includes at least a wavelength region corresponding to blue; and
   the fourth wavelength region includes at least a wavelength region corresponding to near-infrared light.

4. The photoelectric conversion device according to claim 1, wherein
   a control signal for the first circuit, a control signal for the second circuit, a control signal for the third circuit, and a control signal for the fourth circuit are different signals from each other.

5. The photoelectric conversion device according to claim 1, wherein
   a signal line configured to supply a control signal to the first circuit is coupled to a side from which the voltage signal is read from the first pixel column,
   a signal line configured to supply a control signal to the second circuit is coupled to a side from which the voltage signal is read from the second pixel column,
   a signal line configured to supply a control signal to the third circuit is coupled to a side from which the voltage signal is read from the third pixel column, and
   a signal line configured to supply a control signal to the fourth circuit is coupled to a side from which the voltage signal is read from the fourth pixel column.

6. The photoelectric conversion device according to claim 1, wherein
   a signal line configured to supply a control signal to the first circuit is coupled to a plurality of the first circuits,
   a signal line configured to supply a control signal to the second circuit is, coupled to a plurality of the second circuits,
   a signal line configured to supply a control signal to the third circuit is coupled to a plurality of the third circuits, and
   a signal line configured to supply a control signal to the fourth circuit is coupled to a plurality of the fourth circuits.

7. The photoelectric conversion device according to claim 1, wherein
   a number of signal lines, which are configured to supply a control signal to the first circuit, provided between adjacent pixels among the plurality of pixels arranged in the first pixel column,
   a number of signal lines, which are configured to supply a control signal to the second circuit, provided between adjacent pixels among the plurality of pixels arranged in the second pixel column,
   a number of signal lines, which are configured to supply a control signal to the third circuit, provided between adjacent pixels among the plurality of pixels arranged in the third pixel column, and a number of signal lines, which are configured to supply a control signal to the fourth circuit, provided between adjacent pixels among the plurality of pixels arranged in the fourth pixel column, are all equal to each other.

8. The photoelectric conversion device according to claim 1, further comprising:
signal processing circuits that are disposed on both sides of the photoelectric conversion device in a direction intersecting the predetermined direction.

9. The photoelectric conversion device according to claim 8, wherein the signal processing circuits, which are disposed on both sides of the photoelectric conversion device in the direction intersecting the predetermined direction, are circuits having a same configuration.

10. The photoelectric conversion device according to, claim 1, wherein
a plurality of the first circuits respectively operate at different timings in response to a control signal,
a plurality of the second circuits respectively operate at different timings in response to a control signal,
a plurality of the third circuits respectively operate at different timings in response to a control signal, and
a plurality of the fourth circuits respectively operate at different timings in response to a control signal.

11. The photoelectric conversion device according to claim 1, wherein
a direction in which the first circuit is disposed with respect to the first photoelectric conversion element,
a direction in which the second circuit is disposed with respect to the second photoelectric conversion element,
a direction in which the third circuit is disposed with respect to the third photoelectric conversion element, and
a direction in which the fourth circuit is disposed with respect to the fourth photoelectric conversion element, are all a same direction.

12. The photoelectric conversion device according to claim 1, wherein
the first pixel column is adjacent to the second pixel column and a first simulation pixel column,
the second pixel column is adjacent to the first pixel column and the third pixel column,
the third pixel column is adjacent to the second pixel column and the fourth pixel column, and
the fourth pixel column is adjacent to the third pixel column and a second simulation pixel column.

13. An image reading apparatus comprising:
the photoelectric conversion device according to claim 1.

14. An imaging system comprising:
the photoelectric conversion device according to claim 1.

15. An image forming apparatus comprising:
a photoelectric conversion device including:
a first pixel column that comprises a plurality of pixels disposed in a predetermined direction, wherein each pixel of the plurality of pixels of the first pixel column comprises:
a first photoelectric conversion element configured to receive light of a first wavelength region and generate a signal charge; and
a first circuit configured to convert the signal charge generated by the first photoelectric conversion element into a voltage signal;
a second pixel column that comprises a plurality of pixels disposed in the predetermined direction, wherein each pixel of the plurality of pixels of the second pixel column comprises:
a second photoelectric conversion element configured to receive light of a second wavelength region and generate a signal charge; and
a second circuit configured to convert the signal charge generated by the second photoelectric conversion element into a voltage signal;
a third pixel column that comprises a plurality of pixels disposed in the predetermined direction, wherein each pixel of the plurality of pixels of the third pixel column comprises:
a third photoelectric conversion element configured to receive light of a third wavelength region and generate a signal charge; and
a third circuit configured to convert the signal charge generated by the third photoelectric conversion element into a voltage signal; and
a fourth pixel column that comprises a plurality of pixels disposed in the predetermined direction, wherein each pixel of the plurality of pixels of the fourth pixel column comprises:
a fourth photoelectric conversion element configured to receive light of a fourth wavelength region and generate a signal charge; and
a fourth circuit configured to convert the signal charge generated by the fourth photoelectric conversion element into a voltage signal, wherein
directions of reading voltage signals from the first pixel column and the second pixel column are different from directions of reading the voltage signals from the third pixel column and the fourth pixel column,
the first pixel column is disposed closer to a first end of the photoelectric conversion device than is the second pixel column in a direction intersecting the predetermined direction,
a signal line for reading the voltage signal from the first pixel column is disposed so as to extend from a position where the second pixel column is disposed to the first end in the direction intersecting the predetermined direction,
the, fourth pixel column is disposed closer to a second end of the photoelectric conversion device than is the third pixel column in the direction intersecting the predetermined direction, and
a signal line for reading the voltage signal from the fourth pixel column is disposed so as to extend from a position where the third pixel column is disposed to the second end in the direction intersecting the predetermined direction.

* * * * *